US012603135B2

(12) United States Patent
Yuan et al.

(10) Patent No.: US 12,603,135 B2
(45) Date of Patent: Apr. 14, 2026

(54) UNIFORM GIDL CURRENT DURING NAND ERASE

(71) Applicant: Sandisk Technologies, Inc., Milpitas, CA (US)

(72) Inventors: Jiahui Yuan, Fremont, CA (US); Sarath Puthenthermadam, San Jose, CA (US); Abu Naser Zainuddin, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 198 days.

(21) Appl. No.: 18/415,224

(22) Filed: Jan. 17, 2024

(65) Prior Publication Data

US 2025/0232817 A1     Jul. 17, 2025

(51) Int. Cl.
*G11C 16/16*          (2006.01)
*G11C 16/04*          (2006.01)
*G11C 16/34*          (2006.01)

(52) U.S. Cl.
CPC .......... *G11C 16/16* (2013.01); *G11C 16/0433* (2013.01); *G11C 16/3495* (2013.01)

(58) Field of Classification Search
CPC .. G11C 16/16; G11C 16/0433; G11C 16/3495
See application file for complete search history.

(56) References Cited

U.S. PATENT DOCUMENTS

| | | | |
|---|---|---|---|
| 8,223,558 B2 | 7/2012 | Tanaka et al. | |
| 8,908,435 B2 | 12/2014 | Li et al. | |
| 9,019,775 B2 | 4/2015 | Costa et al. | |
| RE45,871 E | 1/2016 | Lai et al. | |
| 9,343,159 B2 | 5/2016 | Dong et al. | |
| 9,761,320 B1 | 9/2017 | Chen et al. | |
| 10,861,559 B1 | 12/2020 | Desai et al. | |
| 10,923,196 B1 * | 2/2021 | Rabkin | G11C 16/3445 |
| 2016/0055915 A1 | 2/2016 | Dong et al. | |
| 2019/0267106 A1 * | 8/2019 | Date | H10B 41/40 |
| 2023/0087334 A1 | 3/2023 | Oosera et al. | |
| 2024/0395332 A1 | 11/2024 | Wang et al. | |

OTHER PUBLICATIONS

International Search Report & The Written Opinion of the International Searching Authority dated Mar. 27, 2025, International Application No. PCT/US2025/010009.

* cited by examiner

*Primary Examiner* — Alexander Sofocleous
*Assistant Examiner* — Joseph Fidelis Stormes
(74) *Attorney, Agent, or Firm* — Pearl Cohen Zedek Latzer Baratz LLP

(57)          ABSTRACT

Technology for gate induced drain leakage (GIDL) erase of NAND strings. The drain-to-gate voltage of a source side select transistor (or transistors) is trimmed to compensate for different physical characteristics of the NAND strings in different regions of a memory system. The drain-to-gate voltage generates a GIDL current at the source end of a NAND string during a GIDL erase. The memory system uses different magnitudes for the drain-to-gate voltage applied to source side select transistor(s) on NAND strings in different regions of the memory system to provide for more uniform GIDL current during erase.

20 Claims, 19 Drawing Sheets

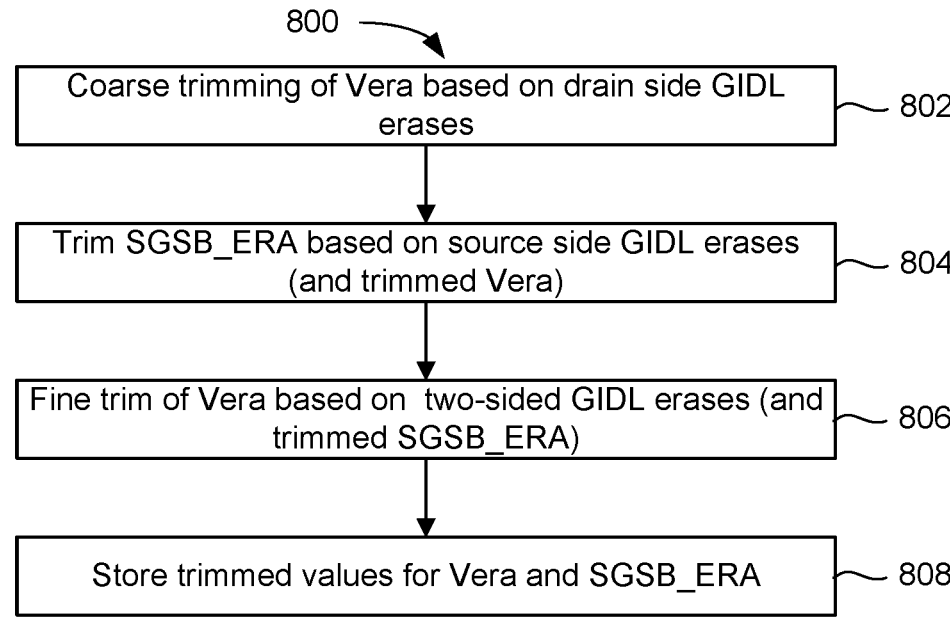

800

| Coarse trimming of Vera based on drain side GIDL erases | ~ 802 |

| Trim SGSB_ERA based on source side GIDL erases (and trimmed Vera) | ~ 804 |

| Fine trim of Vera based on two-sided GIDL erases (and trimmed SGSB_ERA) | ~ 806 |

| Store trimmed values for Vera and SGSB_ERA | ~ 808 |

Figure 9

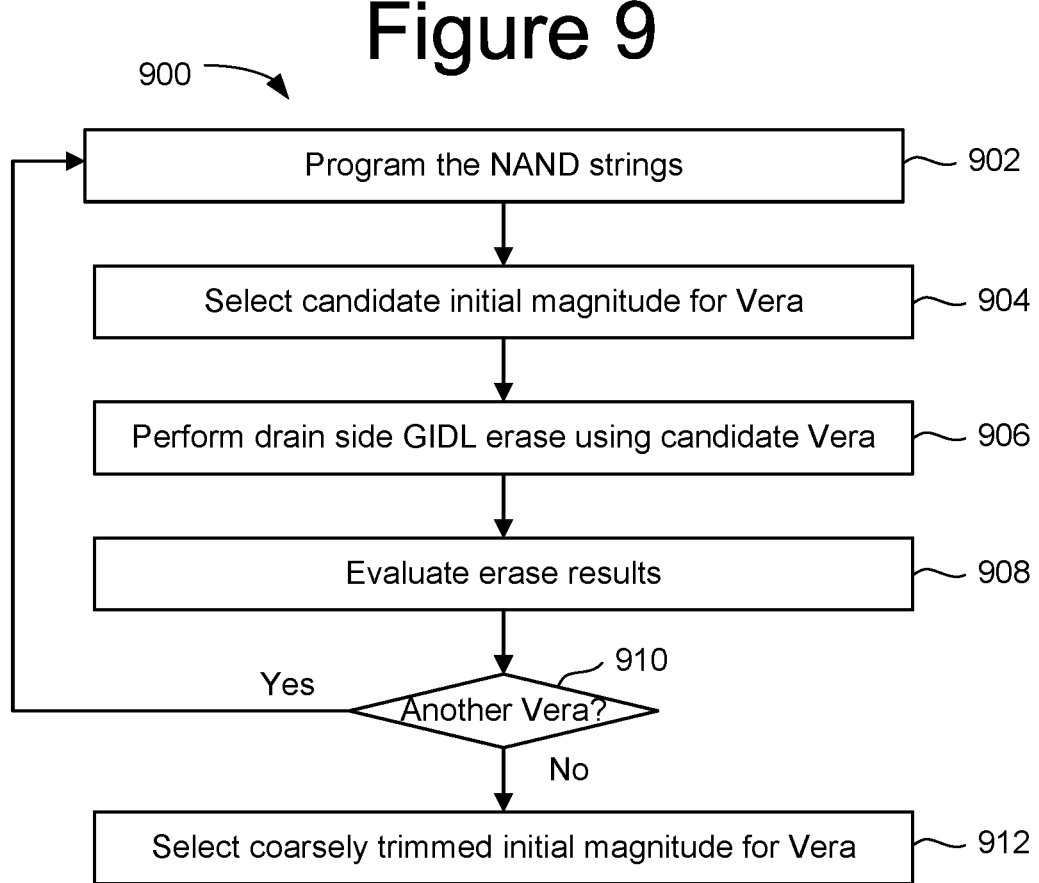

900

| Program the NAND strings | ~ 902 |

| Select candidate initial magnitude for Vera | ~ 904 |

| Perform drain side GIDL erase using candidate Vera | ~ 906 |

| Evaluate erase results | ~ 908 |

910

Yes

Another Vera?

No

| Select coarsely trimmed initial magnitude for Vera | ~ 912 |

1000

Set initial magnitude of Vera, Set Loop to 0 — 1002

Apply Vera to bit lines — 1004

Apply default GIDL voltage to SGDT — 1006

Apply Vera to source line — 1008

Apply voltage to SGSB to prevent GIDL current — 1010

Apply erase enable voltage to word lines — 1012

Verify the erase — 1014

1016 Erase pass? — Yes — 1018 status = pass

No

1020 Loop > Max? — Yes — 1022 status = fail

No

Step up magnitude of Vera; Increment Loop — 1024

1100

Program the NAND strings — 1102

Select candidate value for SGSB_ERA — 1104

Perform GIDL erase using candidate SGSB_ERA — 1106

Evaluate erase results — 1108

Another SGSB_ERA? — 1110

Yes

No

Select trimmed value for SGSB_ERA — 1112

1200

1300

Program the NAND strings — 1302

Select candidate initial magnitude for Vera — 1304

Perform two-sided GIDL erase using candidate Vera — 1306

Evaluate erase results — 1308

Yes    Another Vera? — 1310

No

Select finely trimmed initial magnitude for Vera — 1312

<u>1400</u>

UNIFORM GIDL CURRENT DURING NAND ERASE

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional (3D). One type of 3D structure has non-volatile memory cells arranged as vertical NAND strings. One type of three-dimensional memory structure has alternating horizontal dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with layers of materials including a charge-trapping material to create a vertical column of memory cells (e.g., NAND string).

The 3D memory structure may be arranged into units that are commonly referred to as blocks. For example, a block in a NAND memory system contains many NAND strings. A NAND string contains memory cell transistors connected in series, a drain side select gate at one end, and a source side select gate at the other end. A select gate has one or more transistors in series. Each NAND string is associated with a bit line. The block typically has many word lines that provide voltages to the control gates of the memory cell transistors. In some architectures, each word line connects to the control gate of one memory cell on each respective NAND string in the block. Each memory cell transistor may have a charge storage region. To program a memory cell transistor electrons are stored in the charge-trapping region. The threshold voltage (Vt) of a memory cell transistor is increased in proportion to the amount of stored charge. During an erase operation, the electrons return to the channel.

For memory such as NAND, a large set of memory cells are erased prior to programming. One technique for erasing is referred to herein as a gate induced drain leakage (GIDL) erase. A GIDL erase uses a GIDL current to charge up the NAND string channel. An erase enable voltage is applied to control gates of the memory cells, while maintaining the string channel potential to erase the memory cells. The GIDL current is generated by causing a drain-to-gate voltage at a select transistor (drain side and/or source side). The GIDL current may result when the select transistor drain voltage is significantly higher than the select transistor control gate voltage. GIDL current is a result of carrier generation, i.e., electron-hole pair generation due to band-to-band tunneling and/or trap-assisted generation. During erase, the holes may tunnel from the channel to the charge storage region of memory cells and recombine with electrons there, to lower the Vt of the memory cells.

It is desirable to increase NAND density per die, as well as to decrease cost per bit. One strategy to both increase NAND density and to decrease cost per bit is to increase the number of memory cells on a NAND string, which may include increasing the length of the NAND string. However, increasing the length of the NAND string makes it more difficult to provide sufficient GIDL current to erase the NAND memory cells.

BRIEF DESCRIPTION OF THE DRAWINGS

Like-numbered elements refer to common components in the different figures.

FIG. 4A is a block diagram of one example of a memory structure having two planes.

FIG. 8 is a flowchart of one embodiment of a process of trimming erase parameters.

FIG. 9 is a flowchart of one embodiment of a process of coarse trimming of the erase voltage (Vera) based on drain-side GIDL erases.

DETAILED DESCRIPTION

Technology is disclosed pertaining to GIDL erase of NAND strings. The amount of source side GIDL current depends on physical characteristics at the source end of the NAND strings. The physical characteristics at the source end of NAND strings can vary considerably between NAND strings in different regions of the memory system. One physical characteristic that has a significant impact on GIDL current generation is the concentration of a dopant such as phosphorus. The concentration of the dopant depends on diffusion of the dopant during fabrication, which can vary between NAND strings in different regions.

In an embodiment, the drain-to-gate voltage of a source side select transistor (or transistors) is trimmed to compensate for different physical characteristics of the NAND strings in different regions of the memory system. The drain-to-gate voltage is the difference between an erase voltage applied to the source line and the voltage applied to the gate of the source side select transistor(s). Herein this drain-to-gate voltage that generates a GIDL current at the source end of a NAND string during a GIDL erase is referred to as a "source side GIDL current generation voltage" or more briefly as a "source GIDL voltage". Herein the term SGSB_ERA may be used to refer to the source side GIDL current generation voltage. Increasing the magnitude of the source GIDL voltage increases the GIDL current. Decreasing the magnitude of the source GIDL generation voltage decreases the GIDL current. In an embodiment, the memory system uses different magnitudes for the source GIDL voltage for NAND strings in different regions of the memory system to provide for more uniform GIDL current during erase. The memory system uses a sufficiently high source GIDL voltage for NAND strings having a relatively low amount of dopant diffusion near the source side select transistor(s) to generate sufficient GIDL current. Further note that if the source GIDL voltage is too high then damage could occur to the NAND string. This damage may result from trapping of electrons in a dielectric near the source side select transistor(s), which can undesirably raise the Vt of the source side select transistor(s). The memory system avoids such damage by keeping the source GIDL voltage for NAND strings having sufficient dopant diffusion to a lower magnitude that still generates sufficient GIDL current during erase.

Figure 1:
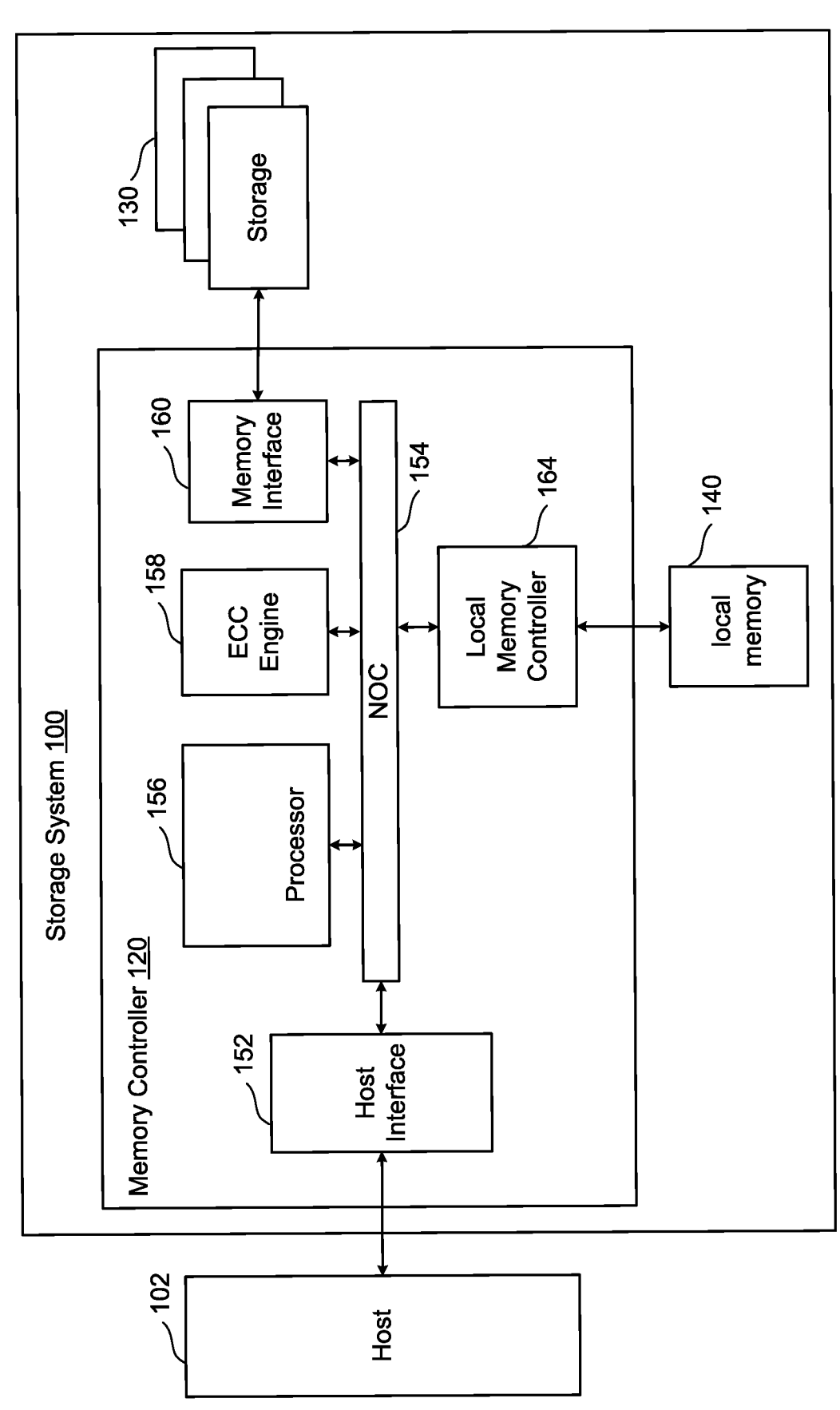
FIG. 1 is a block diagram depicting one embodiment of a storage system.

FIG. 1 is a block diagram of one embodiment of a storage system 100 that implements the technology described herein. The storage system 100 is configured to implement embodiments of erase of NAND memory. In one embodiment, storage system 100 is a solid state drive ("SSD"). Storage system 100 may be referred to as a "non-volatile storage system." Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit.

NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory dies. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160

(or another portion of controller 120) implements a scheduler and buffer for transmitting data to and receiving data from one or more memory die.

Figure 2A:
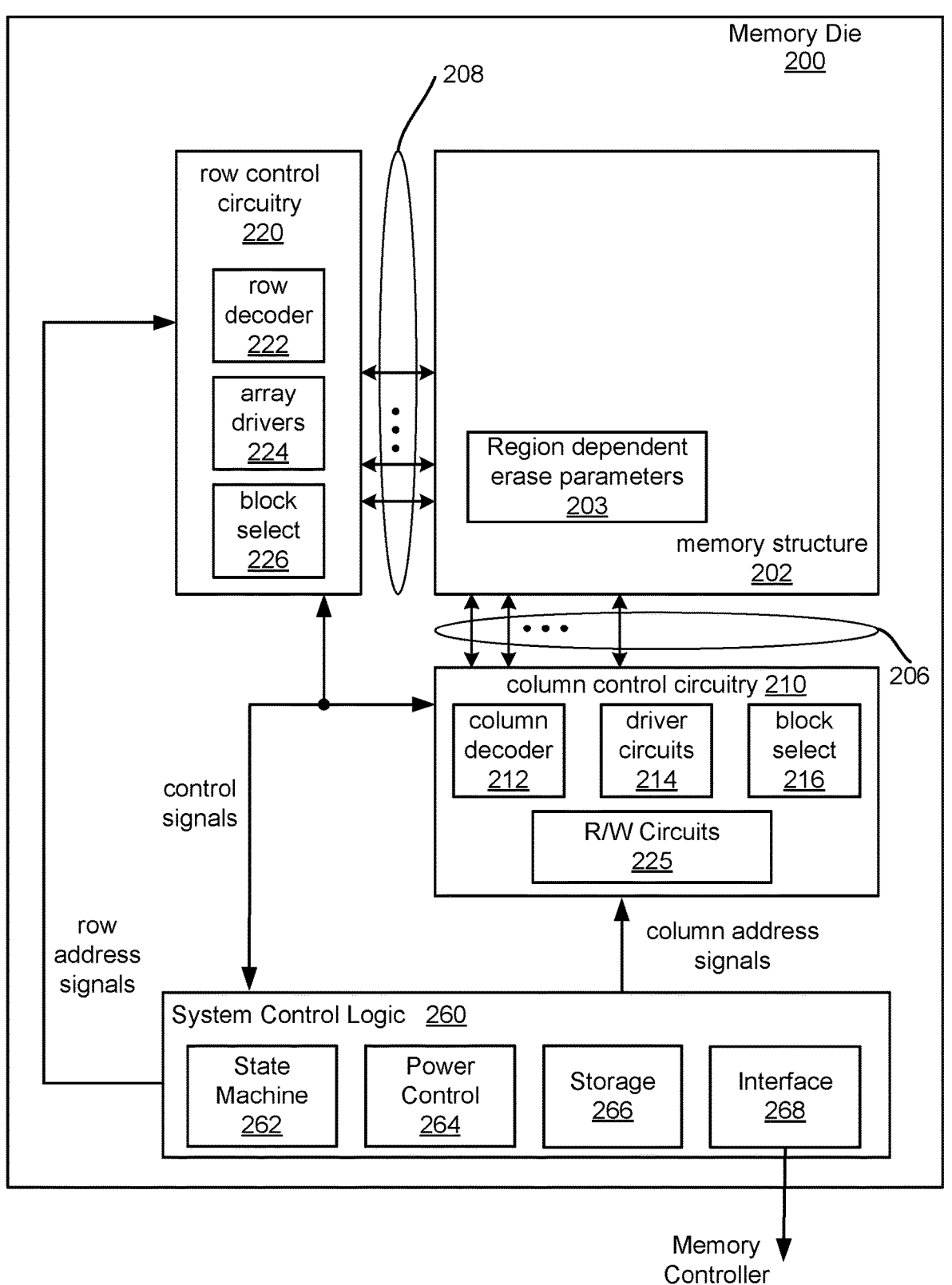
FIG. 2A is a block diagram of one embodiment of a memory die.
Figure 2B:
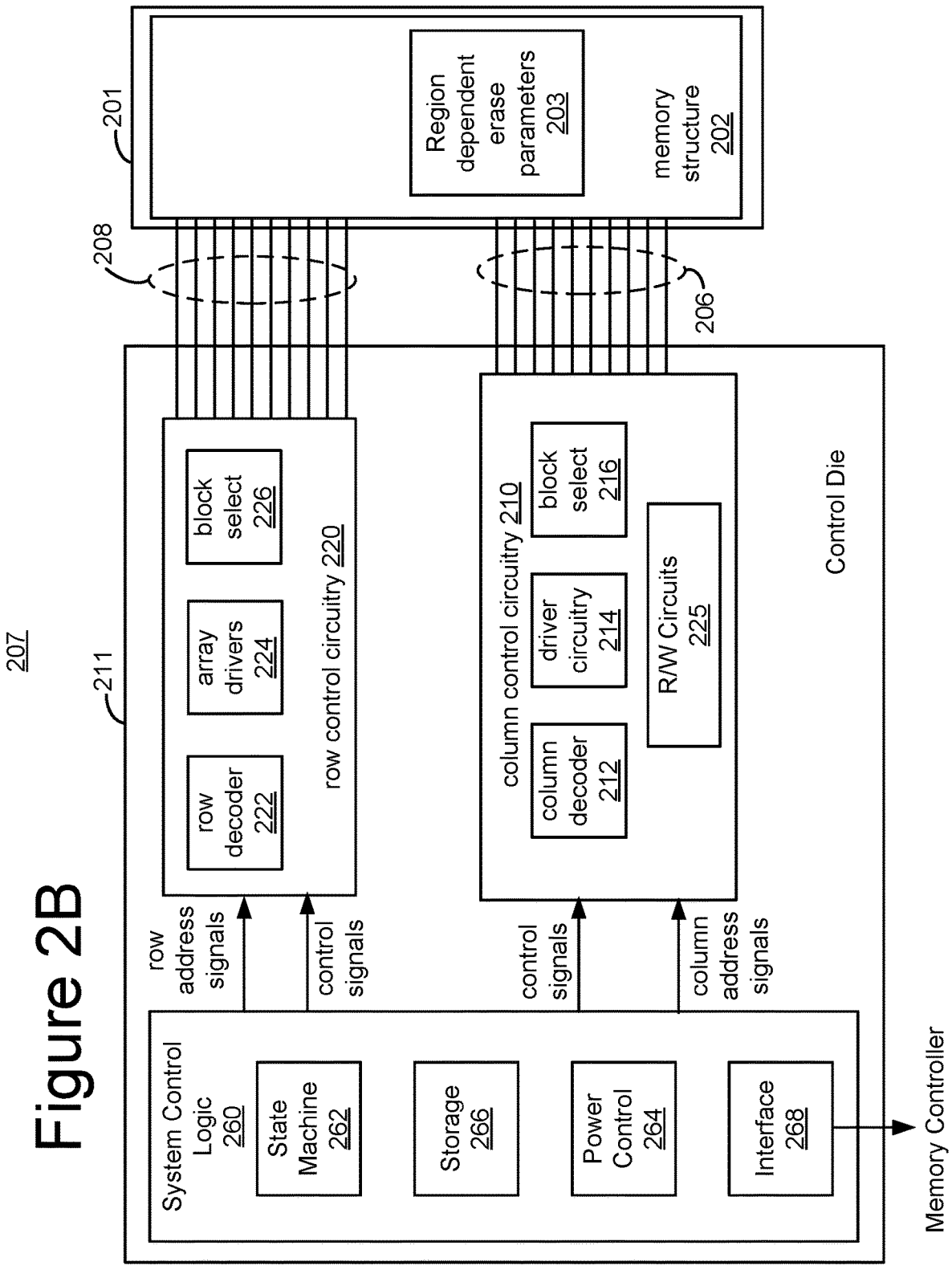
FIG. 2B is a block diagram of one embodiment of an integrated memory assembly.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2B are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select 216, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Region dependent erase parameters 203 may be stored in the memory structure 202. The region dependent erase parameters 203 may include a region dependent drain-to-gate voltage for source select transistors on NAND strings. The parameters 203 may be read by the system control logic 260 and, if desired, temporarily stored in storage 266. The erase parameters 203 may be used by, for example, the state machine 262 during GIDL erase of NAND strings in the memory structure 202. In an embodiment, the magnitude of the drain-to-gate voltage for source select transistors during GIDL erase is memory die 200 dependent. Thus, the magnitude of the drain-to-gate voltage for source select transistors on NAND strings during GIDL erase may be tailored to physical characteristics of NAND strings on that memory die 200. The aforementioned drain-to-gate voltage can be tailored to physical characteristics of NAND strings in another region. For example, the aforementioned drain-to-gate voltage may be tailored to physical characteristics of NAND strings in a particular plane on the memory die 200. As still another example, the aforementioned drain-to-gate voltage may be tailored to physical characteristics of NAND strings in zone of blocks on the memory die 200. Tailoring the drain-to-gate voltage to physical characteristics of NAND strings provides for a more uniform GIDL current from one region to the next.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used. In one embodiment, the memory die 200 receives a command via memory controller interface 268 to perform a post-program erase.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2B. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on one die connected to the periphery elements on the other die. Although the following will focus on a bonded memory circuit of one memory die and one control die, other embodiments can use more dies, such as two memory dies and one control die, for example.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include, but is not limited to, any one of or any combination of memory controller 120, processor 156, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, storage 130, memory die 200, integrated memory assembly 207, and/or control die 211.

Figure 3A:
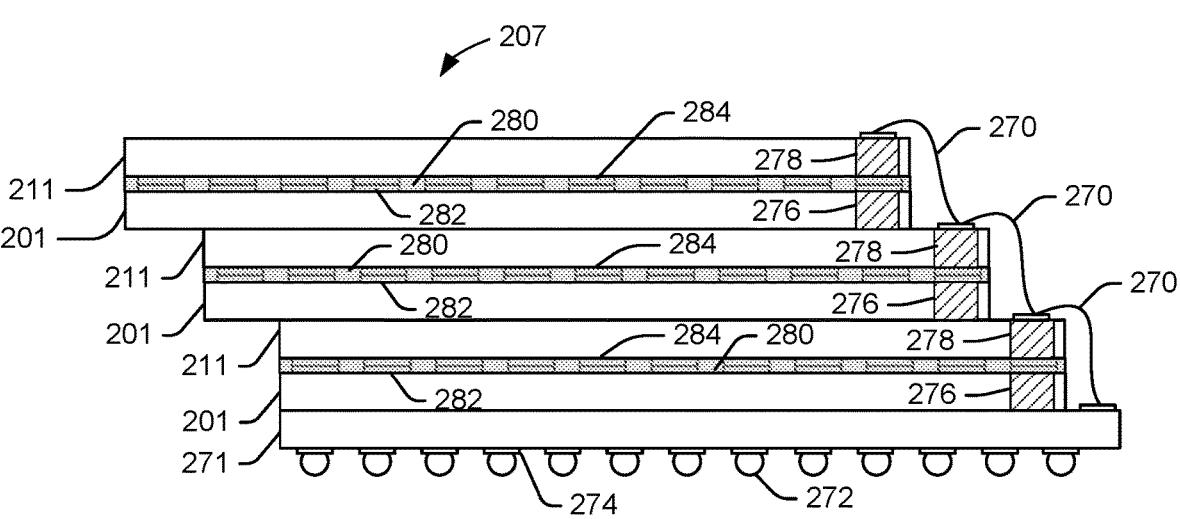
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
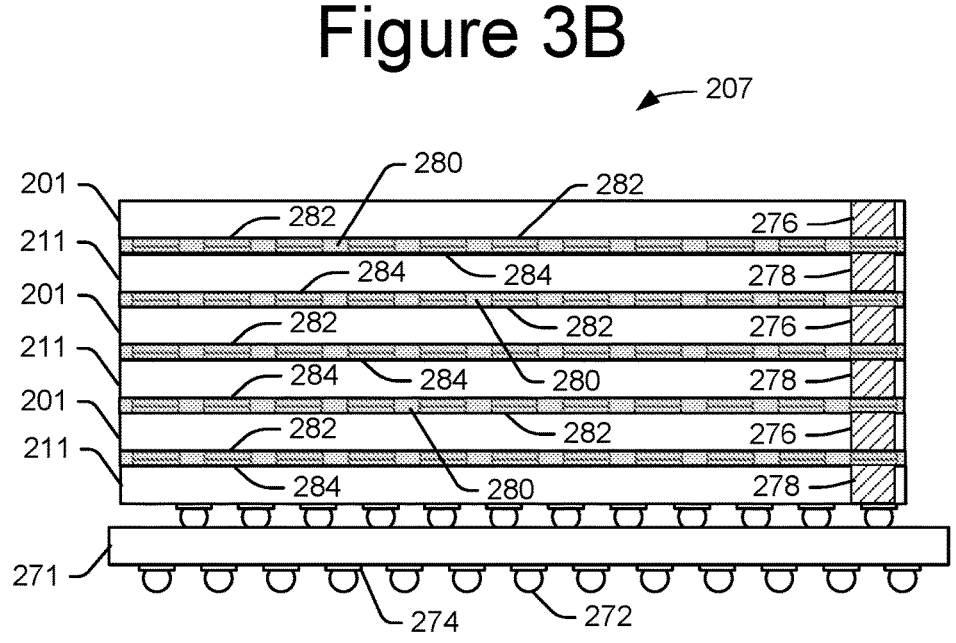

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4:
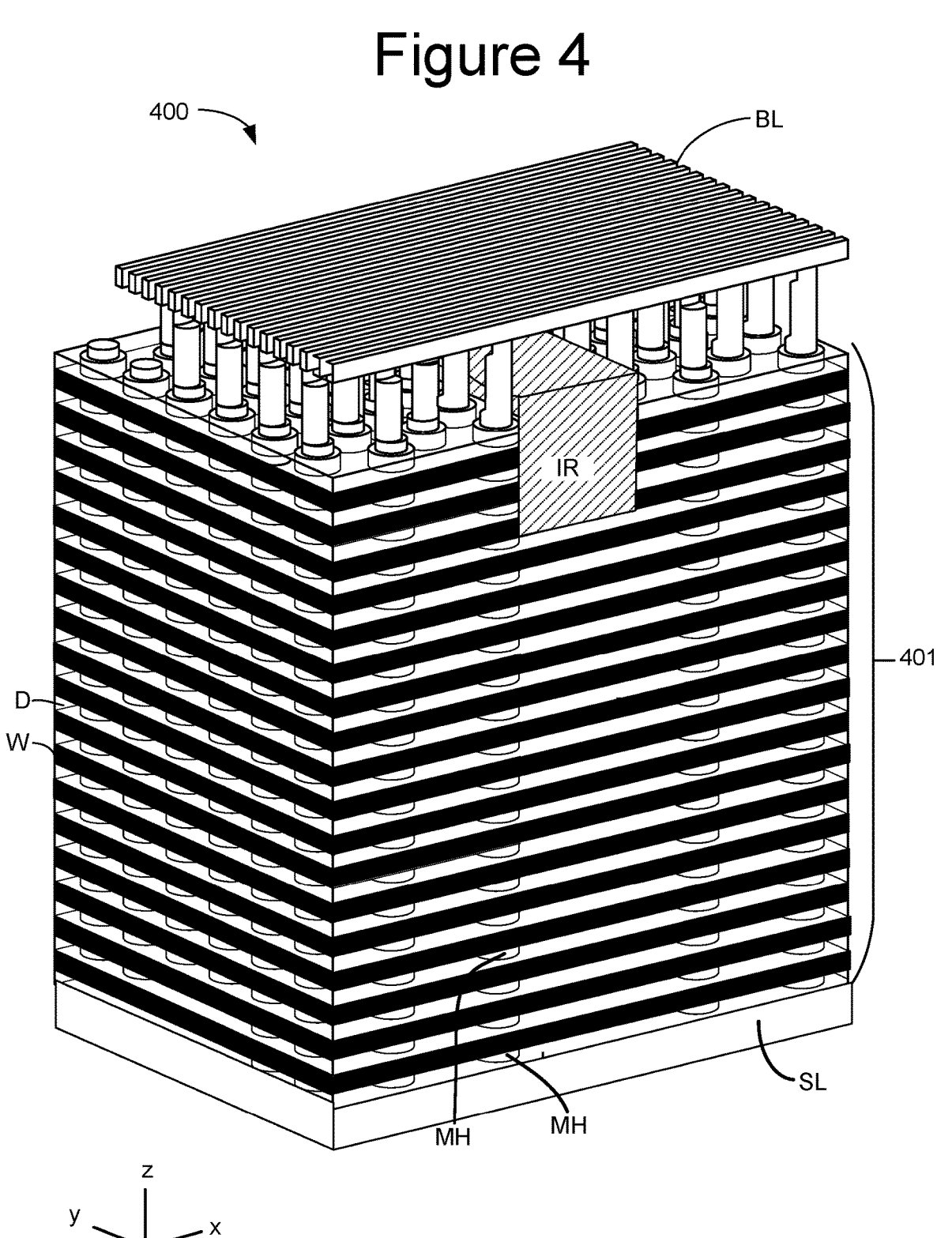
FIG. 4 is a perspective view of a portion of one example of a monolithic three dimensional memory structure.

FIG. 4 is a perspective view of a portion of one example of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
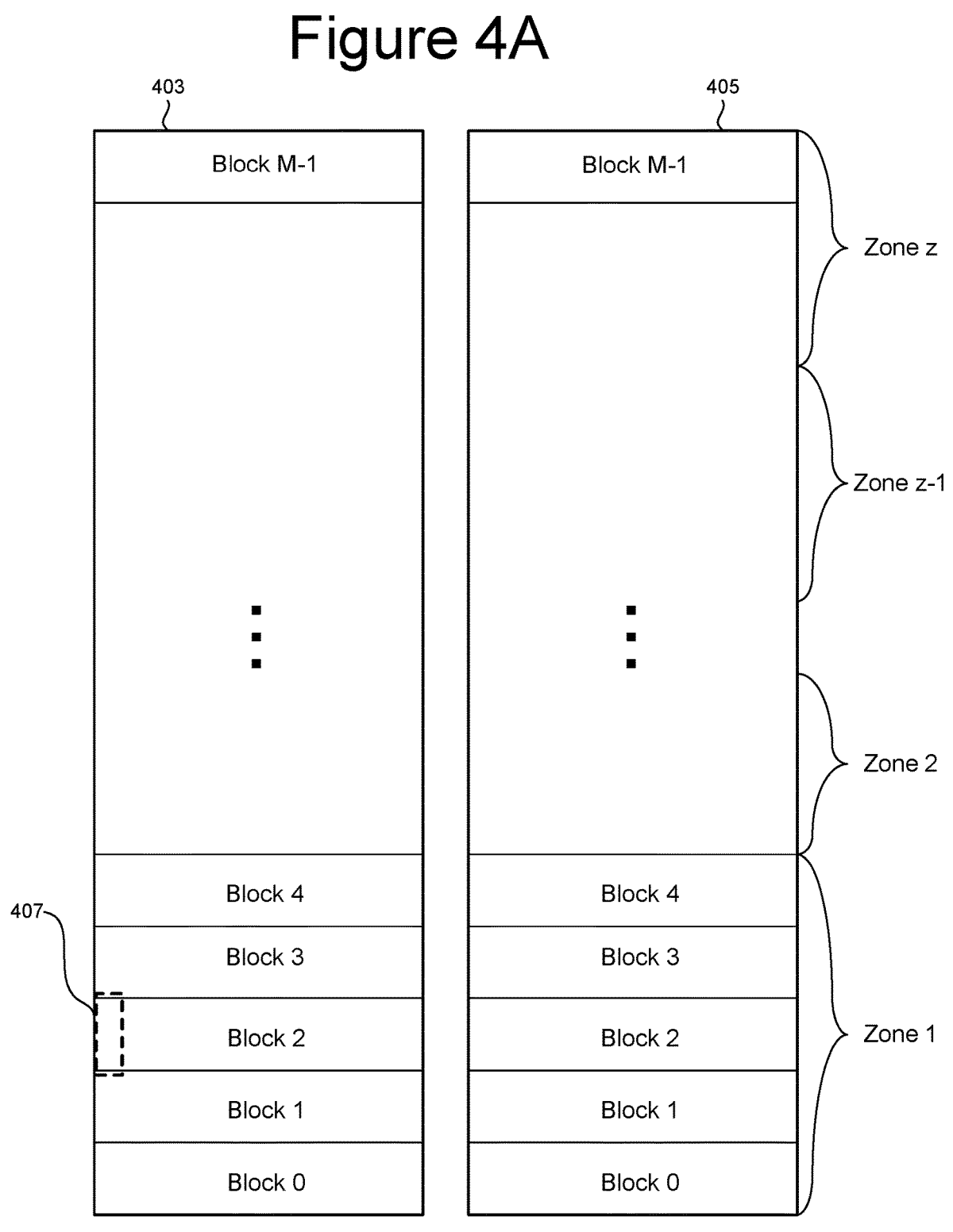

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a group of connected memory cells as the memory cells of a block share a common set of word lines. For example, the word lines for a block are all connected to all of the vertical NAND strings for that physical block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

In one embodiment, erase parameters are plane dependent by which it is meant that each plane (e.g., 403, 405) may have one or more erase parameters tailored to that plane. In one embodiment, the source GIDL voltage is plane dependent. Thus, a different source GIDL voltage may be used in plane 403 than in plane 405. The different source GIDL voltages compensate for physical differences between the two planes to provide for more uniform GIDL current between the planes.

FIG. 4A shows that the blocks in a plane may be divided into zones based on physical location of the blocks within the plane. In one embodiment, erase parameters such as the source GIDL voltage are zone dependent by which it is meant that each zone of blocks may have one or more erase parameters tailored to that zone of blocks. Applying different source GIDL voltages in different zones compensate for physical differences between the zones to provide for more uniform GIDL current between the zones.

Figure 4B:
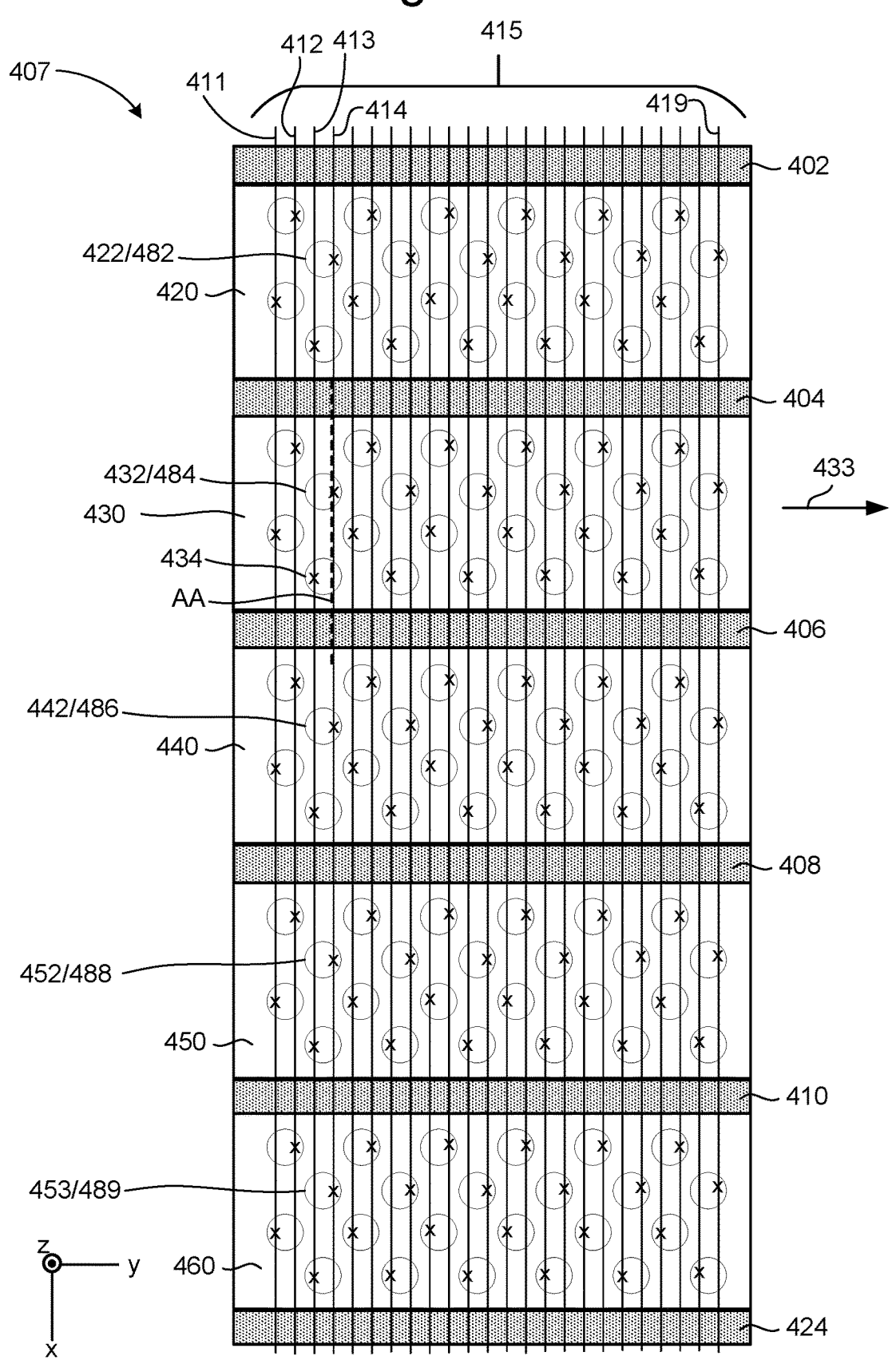
FIG. 4B is a block diagram depicting a top view of a portion of physical block of memory cells.

FIGS. 4B-4E depict an example three dimensional ("3D") NAND structure, which can be used in the implementation of memory structure 202 of FIGS. 2B and 2C. FIG. 4B is a diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows 24 bit lines because only a portion of the block is depicted. It is contemplated that more than 24 bit lines connected to vertical columns of the block. Each of the circles representing vertical columns has an "x" to indicate its connection to one bit line. For example, bit line 414 is connected to vertical columns 422, 432, 442, 452, and 453.

The block depicted in FIG. 4B includes a set of isolation regions 402, 404, 406, 408, 410, and 424, which may be formed of $SiO_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408, or 410.

In one example implementation, a bit line only connects to one vertical column/NAND string in each of regions (sub-blocks) 420, 430, 440, 450, and 460. In that implementation, each block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
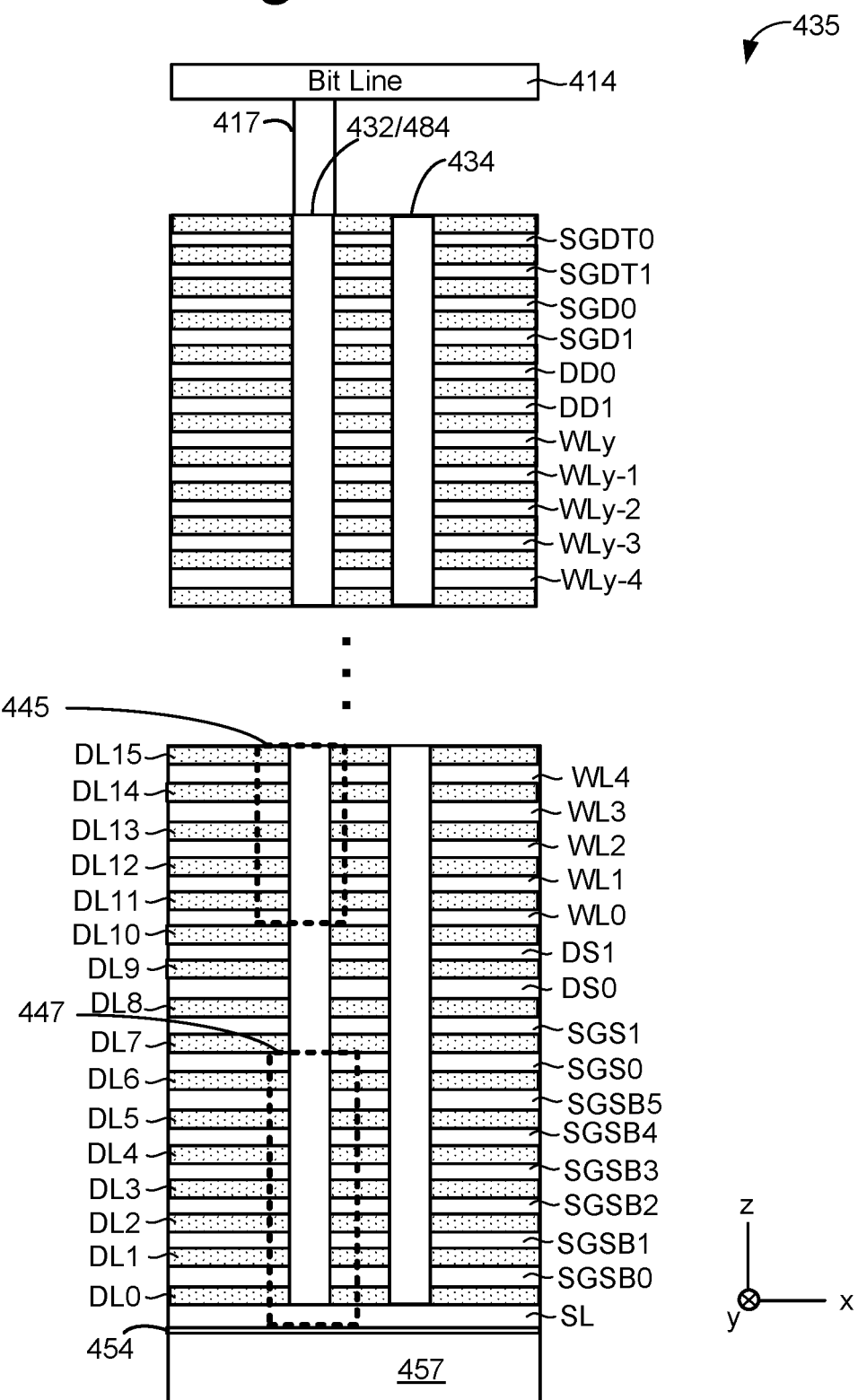
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. In an embodiment, the topmost SGD layers (SGDT0, SGDT1) contain transistors that are used to generate GIDL current to erase memory cells. The SGD layers may have more or fewer than four layers. The SGS layers includes SGSB0, SGSB1, SGSB2, SGSB3, SGSB4, SGSB5, SGS0, and SGS1. In an embodiment, the bottommost SGS layers (SGSB0, SGSB1, SGSB2, SGSB3, SGSB4, SGSB5) contain transistors that are used to generate GIDL current to erase memory cells. The SGS layers may have more or fewer than eight layers. Four dummy word line layers DD0, DD1, DS1, and DS0 are provided, in addition to the data word line layers WL0-WLy. The may be more than one hundred word line layers. There may be more or fewer than four dummy word line layers. Each NAND string has a drain side select gate at the SGD layers. Each NAND string has a source side select gate at the SGS layers. Also depicted are dielectric layers (layers DL0-DL15 are labeled). Dielectric layers also exist on the upper portion of the stack 435, but those dielectric layers are not labeled.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WLy connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

Figure 4D:
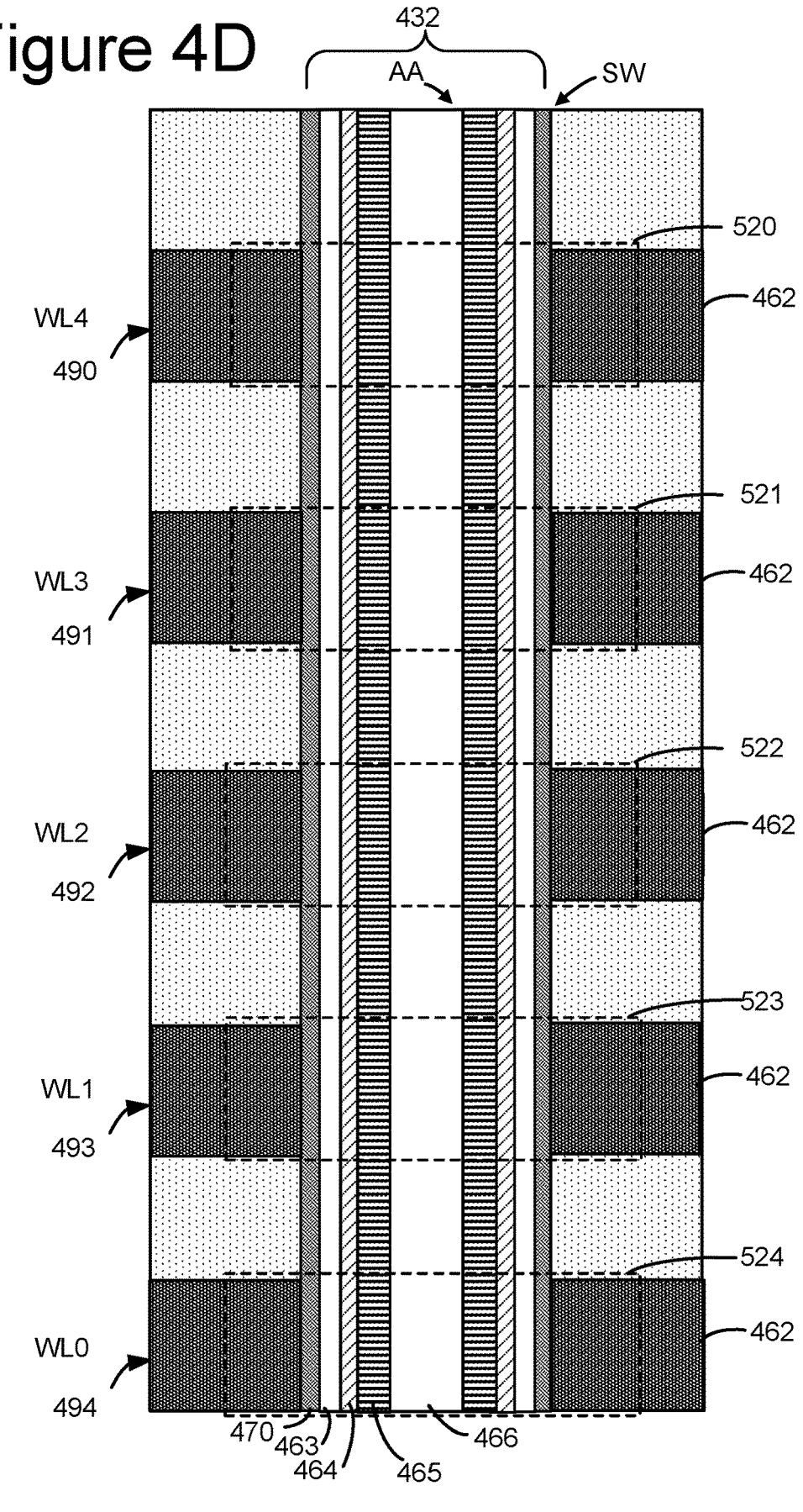
FIG. 4D depicts a view of region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers)

comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
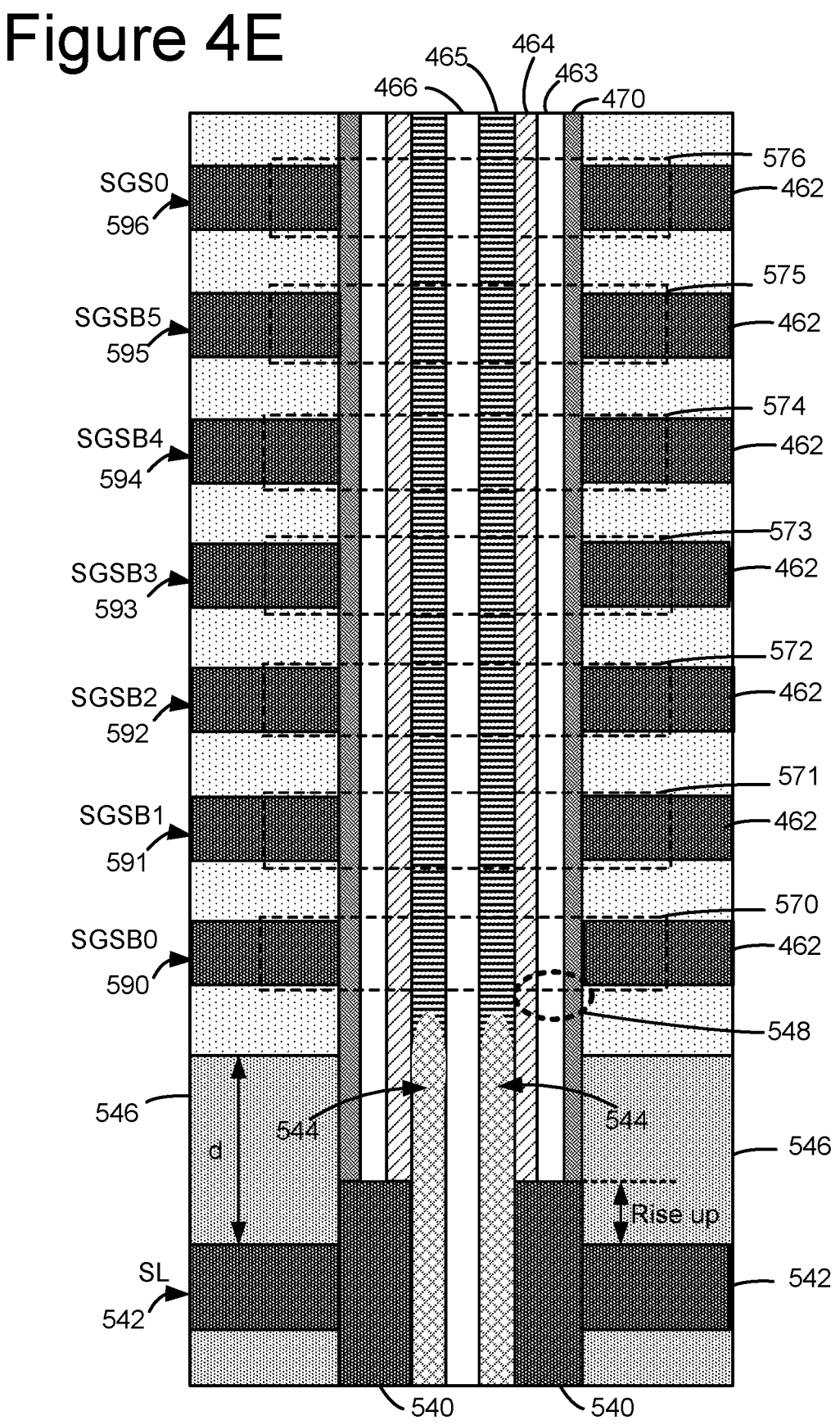
FIG. 4E depicts a view of region 447 of FIG. 4C.

FIG. 4E depicts a view of the region 447 of FIG. 4C. Source side select transistors 570, 571, 572, 573, 574, 575, and 576 are indicated by the dashed lines. The layers 470, 463, 464, 465 along the sidewall (SW) of the memory hole 432 are depicted (see FIG. 4D). A select line layer can be formed from the conductive metal 462 (see FIG. 4D) such as Tungsten as a control gate to the select transistors SGSB0, SGSB1, SGSB2, SGSB3, SGSB4, SGSB5, and SGS0, respectively. For example, control gates 590, 591, 592, 593, 594, 595, and 596 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

FIG. 4E shows a source line (SL) 542 and a plug region 540. The source line 542 is formed from a conductive material such as tungsten or silicon. The plug region 540 is formed from a conductive material such as silicon. The plug region 540 may be single crystal silicon, but single crystal silicon is not a requirement. The bottom portion of the channel 465 is physically connected to the polysilicon region 540. The distance between the top of the SL 542 and the top of polysilicon region 540 is referred to as a "rise up". The rise up distance may be due to characteristics of the fabrication process. The rise up distance may depend on the length of the memory hole. The rise up distance may increase if the length of the memory hole increases (again, due to the nature of the fabrication process). Therefore, if the memory hole length is made longer to accommodate more memory cells, the rise up distance may increase as a result of the nature of the fabrication process. The length of the rise up may contribute to uncertainty in the amount of GIDL current that is generated at the source end.

DSC-Poly region 546 is depicted above the SL 542. The DSC-Poly region 546 has a vertical length "d". Due to the nature of the fabrication process the length "d" may increase if the memory hole length is made longer to accommodate more memory cells. The length of the DSC-Poly region 546 may also contribute to uncertainty in the amount of GIDL current that is generated at the source end.

A diffusion region 544 is depicted near the bottom of the channel 465. The diffusion region 544 may be formed by adding a dopant to the channel 465. Thus diffusion region 544 may be doped silicon. In one embodiment, the dopant is phosphorous. The area 544 of the channel 465 shows a general area in which the phosphorous may diffuse. The fabrication process typically includes a high temperature anneal to diffuse the dopant. The anneal time may be increased to account for an increase in "d", as well as in increase in the rise up. However, a longer anneal time may lead to lower control over the diffusion of the dopant, which may contribute to uncertainty in the amount of GIDL current that is generated at the source end.

As depicted in FIG. 4E, the diffusion region 544 extends upwards in the channel 465 to a level between the top of DSC-poly 546 and the level of the gate of SGSB0. However, there may be some NAND string to NAND string variation in how far upward the diffusion region 544 extends. Also note that the distance "d" in the DSC-poly region 546 impacts how far the diffusion region 544 needs to extend upwards. Depending on the fabrication process and generation, the distance d may be made larger. Thus, NAND strings in different regions may have different amounts of dopant near the SGSB transistors, which may impact GIDL current generation.

In an embodiment, the source GIDL voltage (SGSB_ERA) is larger for NAND strings having a diffusion shortage (e.g., less dopant near SGSB transistors) and smaller for NAND strings having sufficient diffusion. The larger source GIDL voltage for NAND strings having a diffusion shortage increases the GIDL current. The smaller source GIDL voltage for NAND strings having sufficient diffusion allows for sufficient GIDL generation while not causing damage to the NAND strings. Note that if the source GIDL voltage is too large then damage could occur to the NAND string. The oval region labeled 548 points to a region that could be damaged if the source GIDL voltage is too large. The damage to region 548 may include trapped electrons, which could raise the Vt of the SGSB transistors. If the Vt of an SGSB transistor is raised too high then the SGSB transistor may fail to turn on when it should in response to a gate voltage.

Figure 4F:
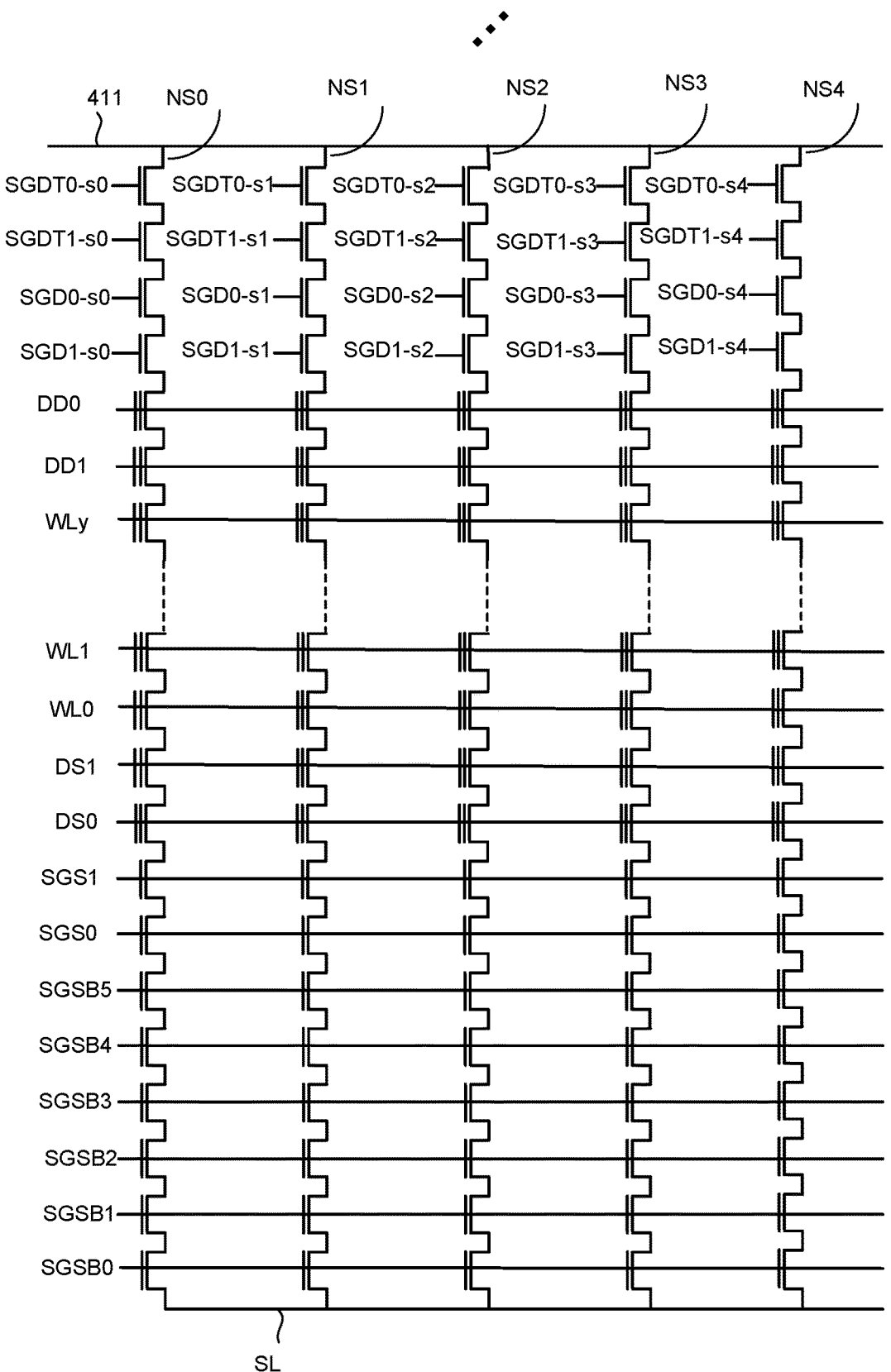
FIG. 4F is a schematic diagram of a portion of one example of a physical block, depicting several NAND strings.

FIG. 4F is a schematic diagram of a portion of the memory array 202. FIG. 4F shows physical data word lines WL0-WLy running across the entire block. The structure of FIG. 4F corresponds to a portion 407 in Block 2 of FIG. 4A, including bit line 411. Within the physical block, in one embodiment, each bit line is connected to five NAND strings. Thus, FIG. 4F shows bit line 411 connected to NAND string NS0, NAND string NS1, NAND string NS2, NAND string NS3, and NAND string NS4.

In one embodiment, there are five sets of drain side select lines in the block. For example, the set of drain side select lines connected to NS0 include SGDT0-*s0*, SGDT1-*s0*, SGD0-*s0*, and SGD1-*s0*. The set of drain side select lines connected to NS1 include SGDT0-*s1*, SGDT1-*s1*, SGD0-*s1*, and SGD1-*s1*. The set of drain side select lines connected to NS2 include SGDT0-*s2*, SGDT1-*s2*, SGD0-*s2*, and SGD1-*s2*. The set of drain side select lines connected to NS3 include SGDT0-*s3*, SGDT1-*s3*, SGD0-*s3*, and SGD1-*s3*. The set of drain side select lines connected to NS4 include SGDT0-*s4*, SGDT1-*s4*, SGD0-*s4*, and SGD1-*s4*. Herein the term "SGD" may be used as a general term to refer to any one or more of the lines in a set of drain side select lines. In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-*s0*, SGDT1-*s0*, SGD0-*s0*, and SGD1-*s0*. A second sub-block corresponds to those vertical NAND strings controlled by SGDT0-*s1*, SGDT1-*s1*, SGD0-*s1*, and SGD1-*s1*. A third sub-block corresponds to those vertical NAND strings controlled by SGDT0-*s2*, SGDT1-*s2*, SGD0-*s2*, and SGD1-*s2*. A fourth sub-block corresponds to those vertical NAND strings controlled by SGDT0-*s3*, SGDT1-*s3*, SGD0-*s3*, and SGD1-*s3*. A fifth sub-block corresponds to those vertical NAND strings controlled by SGDT0-*s4*, SGDT1-*s4*, SGD0-*s4*, and SGD1-*s4*. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a block is operated as an upper tier and a lower tier, wherein the upper tier and the lower tier each form an erase unit. For example, memory cells connected to the lower half of the word lines may be in the lower tier and memory cells connected to the upper half of the word lines may be in the upper tier. A block could be operated in more than two tiers. Erase units can be formed based on other divisions of blocks.

Although the example memories of FIGS. 4-4F are three dimensional memory structure that includes vertical NAND strings with charge-trapping material, other 3D memory structures can also be used with the technology described herein.

Figure 5:
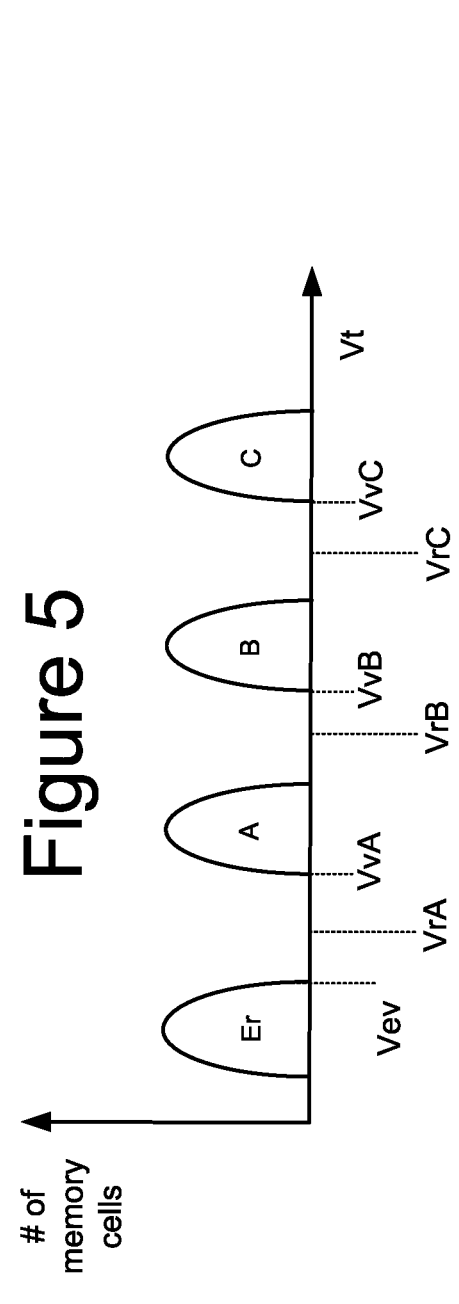
FIG. 5 depicts a threshold voltage (Vt) distributions when each memory cells stores three bits.

The storage systems discussed above can be erased, programmed and read. At the end of a successful programming process, the Vts of the memory cells should be within one or more distributions of Vts for programmed memory cells or within a distribution of Vts for erased memory cells, as appropriate. Memory cells that store one bit of data per memory cell data are referred to as single level cells ("SLC"). The data stored in SLC memory cells is referred to as SLC data; therefore, SLC data comprises one bit per memory cell. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5, each memory cell stores two bits of data. Other embodiments may use other data capacities per memory cell. The first Vt distribution (data state) Er represents memory cells that are erased. The other three Vt distributions (data states) A-C represent memory cells that are programmed and, therefore, are also called programmed states. Three program verify levels (VvA, VvB, and VvC) are depicted. Three read levels (VrA, VrB, and VrC) are depicted. An erase verify level (VeV) is depicted. The erase verify level is used for an erase of the memory cells to complete the erase.

Figure 6:
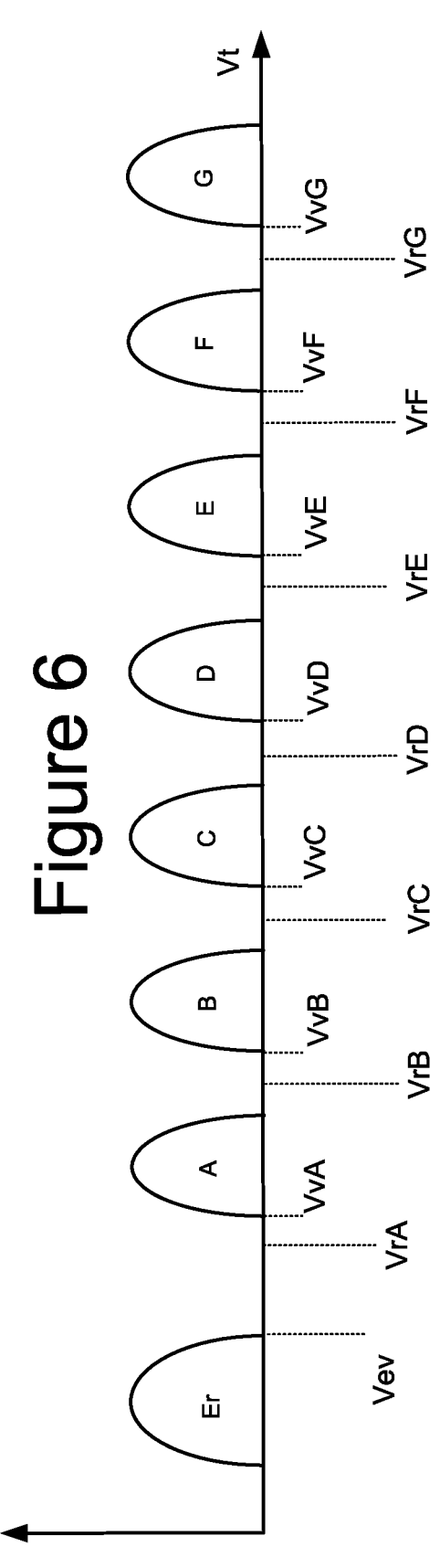
FIG. 6 depicts a threshold voltage (Vt) distributions when each memory cells stores four bits.

FIG. 6 shows eight Vt distributions, corresponding to eight data states. The first Vt distribution (data state) Er represents memory cells that are erased. The other seven Vt distributions (data states) A-G represent memory cells that are programmed and, therefore, are also called programmed states. Each Vt distribution (data state) corresponds to predetermined values for the set of data bits. The specific relationship between the data programmed into the memory cell and the Vt levels of the cell depends upon the data encoding scheme adopted for the cells. In one embodiment, data values are assigned to the Vt ranges using a Gray code assignment so that if the Vt of a memory erroneously shifts to its neighboring physical state, only one bit will be affected. In an embodiment, the number of memory cells in each state is about the same.

FIG. 6 shows seven read reference voltages, VrA, VrB, VrC, VrD, VrE, VrF, and VrG for reading data from memory cells. By testing (e.g., performing sense operations) whether the Vt of a given memory cell is above or below the seven read reference voltages, the system can determine what data state (i.e., A, B, C, D, . . . ) a memory cell is in. FIG. 6 also shows a number of verify reference voltages. The verify reference voltages are VvA, VvB, VvC, VvD, VvE, VvF, and VvG. In some embodiments, when programming memory cells to data state A, the system will test whether those memory cells have a Vt greater than or equal to VvA. If the memory cell has a Vt greater than or equal to VvA, then the memory cell is locked out from further programming. Similar reasoning applies to the other data states. An erase verify level (Vev) is depicted. The erase verify level is used for an erase of the memory cells.

Figure 7:
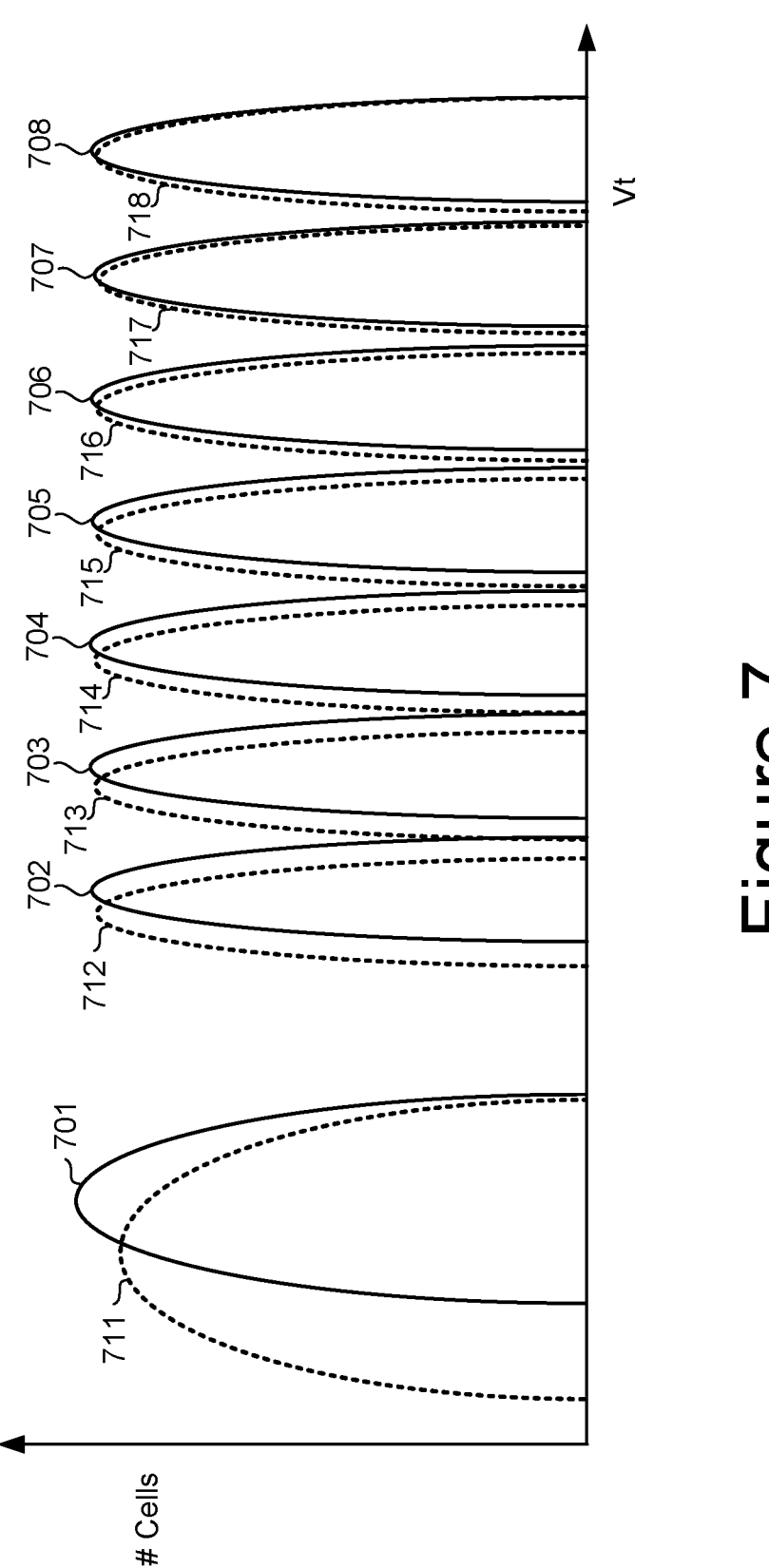
FIG. 7 depicts two sets of threshold voltage distributions to illustrate how erasing with a GIDL current that is lower than desirable can negatively affect performance.

FIG. 7 depicts two sets of threshold voltage distributions to illustrate how erasing with a GIDL current that is lower than desirable can negatively affect performance. Erase Vt distribution 701 is for an example in which the GIDL current has a desirable magnitude. Erase Vt distribution 711 is for an example in which the GIDL current has a lower than desirable magnitude. A low GIDL current may result in the wider erase Vt distribution 711 due to the need for one or more additional erase pulses to complete erase. After the cells are erased, any cell not to stay in the erase state is programmed to a programmed state. Programmed states 702-708 result from programming from the narrower erase distribution 701. Programmed states 712-718 result from programming from the wider erase distribution 711. Programmed states 702-708 are narrower than programmed states 712-718. Narrow programmed states are desirable due to the increased gap between the programmed states.

FIG. 8 is a flowchart of one embodiment of a process 800 of trimming erase parameters. In one embodiment, process 800 is performed during a die sort. However, process 800 can be performed at a time other than die sort. Process 800 may be performed under the direction of a control circuit that instructs a memory die (200, 201) to perform die level operations. One erase parameter that is trimmed is an erase voltage (Vera). The erase voltage (Vera) is applied to the bit lines and/or source line during a GIDL erase. Note that a GIDL erase may include a number or erase loops. The magnitude of Vera may be stepped up from one erase loop to the next. The trimmed Vera refers to the magnitude of Vera that is used in the first erase loop. Another erase parameter that is trimmed is a source GIDL voltage (SGSB_ERA). The source GIDL voltage is defined herein as the difference between Vera and VSGSB (Vera-VSGSB) during a source side GIDL erase (or a two-sided GIDL erase). The voltage applied to the gates of the SGSB transistors is referred to as VSGSB. The magnitude of VSGSB may be stepped up from one erase loop to the next with Vera to keep SGSB_ERA constant through a multi-loop erase procedure. The process 800 may be used to trim the erase parameters on a die-by-die basis, plane-by-plane basis, or some other level of granularity.

Step 802 includes coarse trimming of the erase voltage (Vera) based on drain-side GIDL erases. These drain-side GIDL erases will include erases using different magnitudes for Vera in the initial (first) erase loop. Each drain-side GIDL erase will generate GIDL current at the drain (bit line) end of the NAND strings, but will not generate GIDL current at the source (source line) end of the NAND strings. Further details of embodiments of step 802 are discussed in connection with FIGS. 9 and 10. Step 802 results in the selection of a "coarse" magnitude for Vera. However, this magnitude of Vera will be refined later in process 800.

Step 804 includes trimming the source GIDL voltage (SGSB_ERA) based on GIDL erases. The coarsely trimmed magnitude for Vera is used in step 804. In an embodiment each GIDL erase will generate GIDL current at only the source (source line) end of the NAND strings. Further details of embodiments of step 804 are discussed in connection with FIGS. 11 and 12. Step 804 results in the selection of a magnitude for the source GIDL voltage (SGSB_ERA).

Step 806 includes fine trimming of the erase voltage (Vera) based on two-sided GIDL erases. The trimmed value for the source GIDL voltage (SGSB_ERA) is used in step 806. Further details of an embodiment of step 806 are discussed in connection with FIG. 13.

Step 808 includes storing the trimmed values for the erase voltage (Vera) and the source GIDL voltage (SGSB_ERA). In an embodiment the values are stored as region dependent erase parameters 203 on a memory die (200, 201).

FIG. 9 is a flowchart of one embodiment of a process 900 of coarse trimming of the erase voltage (Vera) based on drain-side GIDL erases. Process 900 may be used in an embodiment of step 802 in FIG. 8. Process 900 may be performed by a combination of circuitry on the memory die (200, 201) and a control circuit off the memory die. Step 902 includes programming the set of NAND strings under test. In one embodiment, all memory cells on the NAND strings are programmed to some target Vt. However, another Vt pattern could be used. Step 904 includes selecting a magnitude for Vera to be used in the initial (first) erase loop. Process 900 will test a number of candidate initial magnitudes for Vera. Step 906 includes performing a drain side GIDL erase using the candidate initial magnitude for Vera. Note that Vera may be stepped up during the GIDL erase. Further details of one embodiment of step 906 are described in connection with FIG. 10. Step 908 in FIG. 9 includes evaluating the results of the erase of step 906. Step 908 may include evaluating one or more metrics pertaining to the quality of the erase. This evaluation may include, but is not limited to, noting how many erase loops it took to complete erase, measuring the width of the erase distribution, etc. Step 910 is a determination of whether another candidate initial magnitude for Vera is to be tested. In one embodiment, the candidate initial magnitudes for Vera are tested from a lower magnitude with a small increase for each new candidate. New candidates may be tested until satisfactory erase results are achieved. As one example, new candidates are tested until the erase completes successfully in a certain number of erase loops. If another candidate Vera is to be tested then steps 902-908 are repeated. When all candidate initial magnitudes for Vera are tested and evaluated, one of the candidate initial magnitudes is selected in step 912 as the coarsely trimmed initial magnitude for Vera.

Note that process 900 is described with respect to testing one set of NAND strings, such as one block. However, steps 902-910 may be performed on many sets of NAND strings (e.g., many blocks). Then, the coarsely trimmed initial magnitude for Vera may be selected based on analysis of all of the tested blocks.

Figure 10:
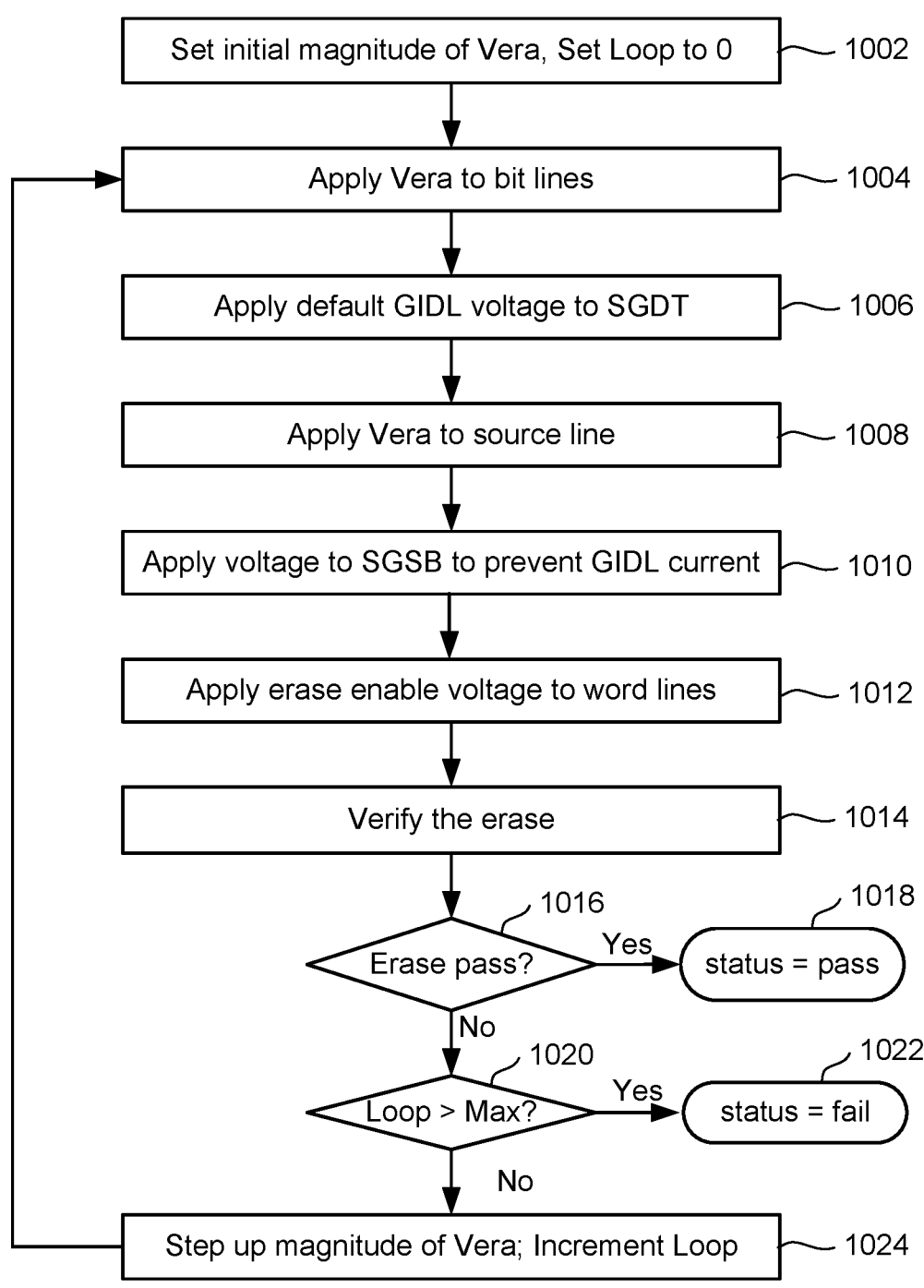
FIG. 10 is a flowchart describing one embodiment of a process for a drain side GDIL erase.

FIG. 10 is a flowchart describing one embodiment of a process 1000 for a drain side GDIL erase. Process 1000 is performed in an embodiment of step 906 in FIG. 9. In an embodiment, circuitry on the die (200, 211) performs process 1000 in response to a command from an off-die control circuit such as memory controller 120. The process 1000 may be used to erase a group of NAND strings in a three-dimensional memory structure. The erase in process 1000 is what is referred to herein as a gate induced drain leakage (GIDL) erase. A GIDL erase uses a GIDL current to charge up the NAND string channel. An erase enable voltage is applied to control gates of the memory cells, while maintaining the string channel potential to erase the memory cells. The GIDL current is generated by causing a drain-to-gate voltage at a select transistor (drain side and/or source side). The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel 465, thereby raising the potential of the channel 465. The other type of carriers, e.g., electrons, are extracted from the channel 465, in the direction of a bit line or in the direction of a source line, by an electric field. During erase, the holes may tunnel from the channel to a charge storage region 463 of memory cells and recombine with electrons there, to lower the threshold voltage of the memory cells. Thus, in an embodiment of two-sided GIDL erase holes are provided from both the drain side and the source side.

Step 1002 includes setting an initial magnitude of an erase voltage (Vera). The initial value for Vera may be set to the value selected in step 904 of FIG. 9 in order to test another candidate magnitude for Vera used in the first loop of a GIDL erase. Step 1002 also includes setting a loop counter to 0. The loop counter will be used to track an allowed number of erase loops prior to ending process 1000 in the event erase has not yet passed. Step 1004 includes applying Vera to bit lines associated with the group of NAND strings being erased. Step 1006 includes applying a voltage (VSGDT) to the top drain side select gate (SGDT). The difference between Vera and VSGDT (Vera-VSGDT) is referred to herein as a drain GIDL generation voltage (SGDT_ERA). Each NAND string has a SGDT, which may include one or more transistors in series. For example, the top drain side select gate may be implemented in more than one layer (e.g., SGDT0, SGDT1, etc.). The voltage applied to the gates of the SGDT transistors GIDL, in combination with Vera applied to the bit lines, results in a GIDL current. Also, the GIDL voltage allows Vera to pass to the NAND channels. The drain GIDL generation voltage (SGDT_ERA) may be the same each loop of the erase process 1000. Thus, the magnitude of VSGDT applied to the gates of SGDT transistors may be increased from one erase loop to the next to account for an increase in Vera from one erase loop to the next.

Step 1008 includes applying Vera to the source line. Step 1010 includes applying a voltage to the gates of the SGSB transistors that will not generate any GIDL current. As one example, Vera-VSGSB is kept to a low voltage that will not result in GIDL current at the source ends of the NAND strings. For example, Vera-VSGSB may be about 5V or 6V. The combination of steps 1008 and 1010 will not result in GIDL current generation at the source end of the NAND strings. In another embodiment, rather than applying Vera to the source line, a much lower voltage is applied to the source line.

Step 1012 includes applying an erase enable voltage to the word lines connected to the group of NAND strings being erased. In one embodiment, the erase enable voltage is 0V but could be other than 0V such as about 0.5V. Thus, the erase of a memory cell includes applying an erase enable voltage (e.g., 0V) to the control gate of the memory cell while applying an erase voltage to a channel or body of the memory cell.

After steps 1004-1012 are performed, an erase verify may be performed in step 1014. The erase verify voltage may be applied to each data WL connected to the group of NAND strings being erased. If all memory cells on a given NAND string have a Vt below the erase verify level then the NAND string will conduct a significant current. Step 1016 is a determination of whether erase is complete. In an embodiment, the system control logic 260 will count the number of NAND strings that have not yet passed erase. In an embodiment, if the number is below an allowed number, then the erase is allowed to pass. If erase has passed then the process 1000 completes with a status of pass in step 1018. If erase has not yet passed then a determination may be made in step 1020 of whether the loop counter has exceeded the maximum. In one embodiment, the erase process is allowed a certain number of loops to complete. If the loop count is greater than the maximum then the process ends with a status of fail in step 1022. If the loop count is not greater than the maximum then the process continues at step 1024. In step 1024, the magnitude of the erase voltage Vera may optionally be increased. Also, the loop count is incremented.

Figure 11:
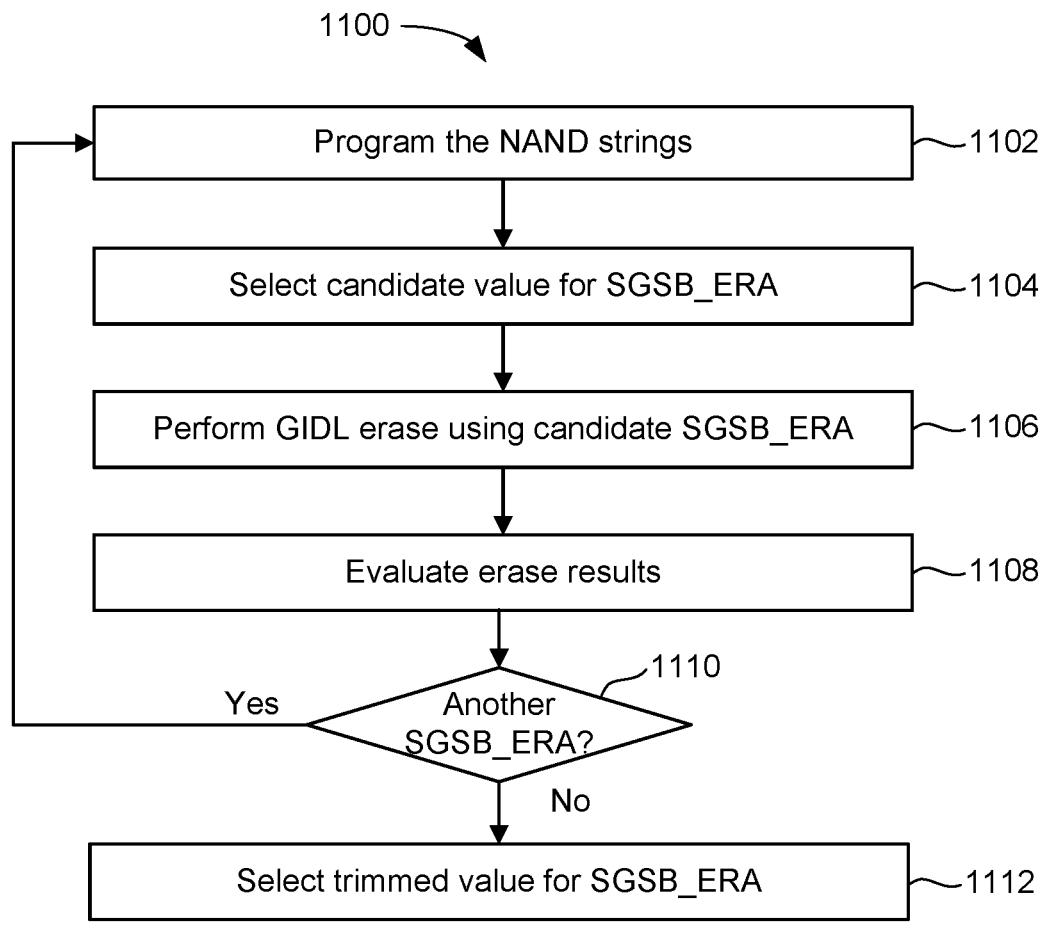
FIG. 11 is a flowchart of one embodiment of a process of trimming a source GIDL generation voltage (SGSB_ERA).

FIG. 11 is a flowchart of one embodiment of a process 1100 of trimming a source GIDL voltage (SGSB_ERA). Process 1100 may be used in one embodiment of step 804 in FIG. 8. Process 1100 may be performed by a combination of circuitry on the memory die (200, 201) and a control circuit off the memory die. Step 1102 includes programming the set of NAND strings under test. In one embodiment, all memory cells on the NAND strings are programmed to some target Vt. However, another Vt pattern could be used. Step 1104 includes selecting a magnitude for the source GIDL generation voltage (SGSB_ERA). Process 1100 will test a number of candidate magnitudes for SGSB_ERA. Step 1106 includes performing a GIDL erase using the selected SGSB_ERA. Also, the coarsely trimmed Vera from step 802 of process 800 is used, in an embodiment. In an embodiment, step 1106 includes a source side GIDL erase. For a source side GIDL erase, GIDL current is generated from the source end of the NAND strings, but not from the drain end of the NAND strings. Further details of one embodiment of step 1106 are described in connection with FIG. 12. Step 1108 in FIG. 11 includes evaluating the results of the erase of step 1106. Step 1108 may evaluate one or more metrics pertaining to the quality of the erase. This evaluation may include, but is not limited to, noting how many erase loops it took to complete erase, measuring the width of the erase distribution, etc. Step 1110 is a determination of whether another candidate magnitude for SGSB_ERA is to be tested. If so, steps 1102-1108 are repeated. In one embodiment, the candidate magnitudes for SGSB_ERA are tested from a lower magnitude with a small increase for each new candidate. New candidates may be tested until satisfactory erase results are achieved. As one example, new candidates are tested until the erase completes successfully in a certain number of erase loops. If another candidate SGSB_ERA is to be tested then steps 1102-1108 are repeated. When all candidate magnitudes for SGSB_ERA are tested and evaluated, one of the candidate magnitudes is selected in step 1112 as the trimmed value for SGSB_ERA.

Note that process 1100 is described with respect to testing one set of NAND strings, such as one block. However, steps 1102-1110 may be performed on many sets of NAND strings (e.g., many blocks). Then, the trimmed SGSB_ERA may be selected based on analysis of all of the tested blocks.

Figure 12:
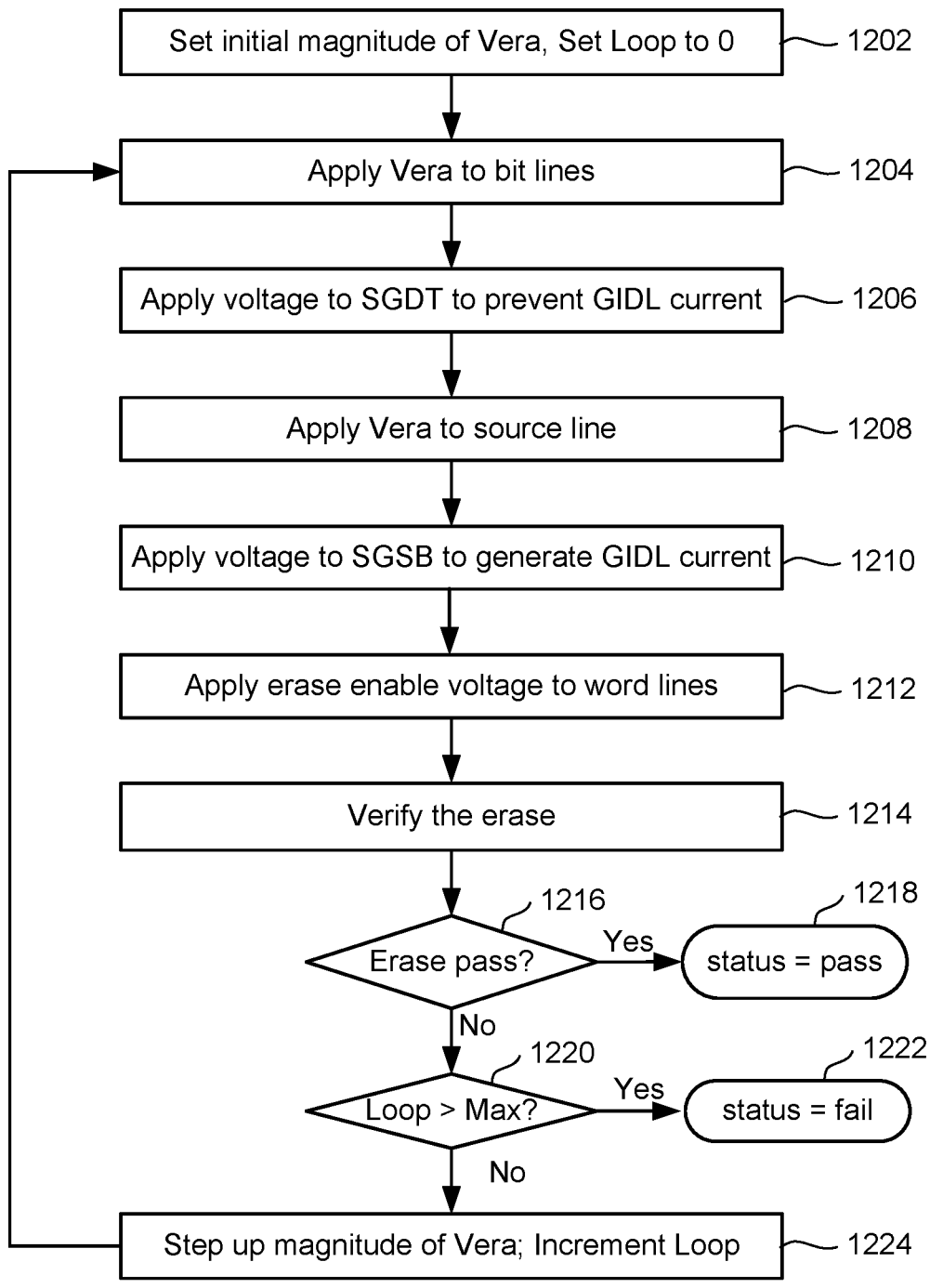
FIG. 12 is a flowchart describing one embodiment of a process for a source-side GDIL erase.

FIG. 12 is a flowchart describing one embodiment of a process 1200 for a source-side GDIL erase. Process 1200 is performed in an embodiment of step 1106 in FIG. 11. In an embodiment, circuitry on the die (200, 211) performs process 1200 in response to a command from an off-die control circuit such as memory controller 120. The process 1200 may be used to erase a group of NAND strings in a three-dimensional memory structure.

Step 1202 includes setting an initial magnitude of the erase voltage (Vera). The initial value for Vera may be set to the coarsely trimmed value that was determined in step 802 of FIG. 8. Step 1202 also includes setting a loop counter to 0. The loop counter will be used to track an allowed number of erase loops prior to ending process 1200 in the event erase has not yet passed. Step 1204 includes applying Vera to bit lines associated with the group of NAND strings being erased. Step 1206 includes applying a voltage to the gates of the SGDT transistors to prevent GIDL current. The voltage to the gates of the SGDT transistors, in combination with Vera applied to the bit lines, does not allow a GIDL current from the drain end of the NAND strings. As an example, the voltage to the gates of the SGDT transistors may be about 5V or 6V less than Vera (or another voltage which does not allow GIDL current generation at the drain (bit line) end of the NAND strings).

Step 1208 includes applying Vera to the source line. Step 1210 includes applying a voltage (VSGSB) to the gates of the SGSB transistors to generate GIDL current. The difference between Vera and VSGSB is referred as the candidate source GIDL voltage (SGSB_ERA). Referring back to FIG. 11, the candidate value may be taken from step 1104. Thus, each time process 1200 is performed on a group of NAND strings a different candidate value for SGSB_ERA may be used. The combination of steps 1208 and 1210 may result in GIDL current generation at the source end of the NAND strings. However, if the value for SGSB_ERA is too low (hence too low a difference Vera-VSGSB) then GIDL current will be lower than desired. As noted above, the physical characteristics at the source end of the NAND strings, such as phosphorous diffusion, will impact the amount of GIDL current generation. Evaluating different magnitudes of SGSB_ERA allows selection of an SGSB_ERA that results in suitable GIDL current generation at the source end of the NAND strings without damaging the SGSB transistors.

Step 1212 includes applying an erase enable voltage to the word lines connected to the group of NAND strings being erased. In one embodiment, the erase enable voltage is 0V but could be other than 0V such as about 0.5V. Thus, the erase of a memory cell includes applying an erase enable voltage (e.g., 0V) to the control gate of the memory cell while applying an erase voltage to a channel or body of the memory cell.

After steps 1204-1212 are performed, an erase verify may be performed in step 1214. The erase verify voltage may be applied to each data WL connected to the group of NAND strings being erased. Step 1216 is a determination of whether erase is complete. In an embodiment, the system control logic 260 will count the number of NAND strings that have not yet passed erase. In an embodiment, if the number is below an allowed number, then the erase is allowed to pass. If erase has passed then the process 1200 completes with a status of pass in step 1218. If erase has not yet passed then a determination may be made in step 1220 of whether the loop counter has exceeded the maximum. In one embodiment, the erase process is allowed a certain number of loops to complete. If the loop count is greater than the maximum then the process ends with a status of fail in step 1222. If the loop count is not greater than the maximum then the process continues at step 1224. In step 1224, the magnitude of the erase voltage Vera may optionally be increased. Also, the loop count is incremented.

Figure 13:
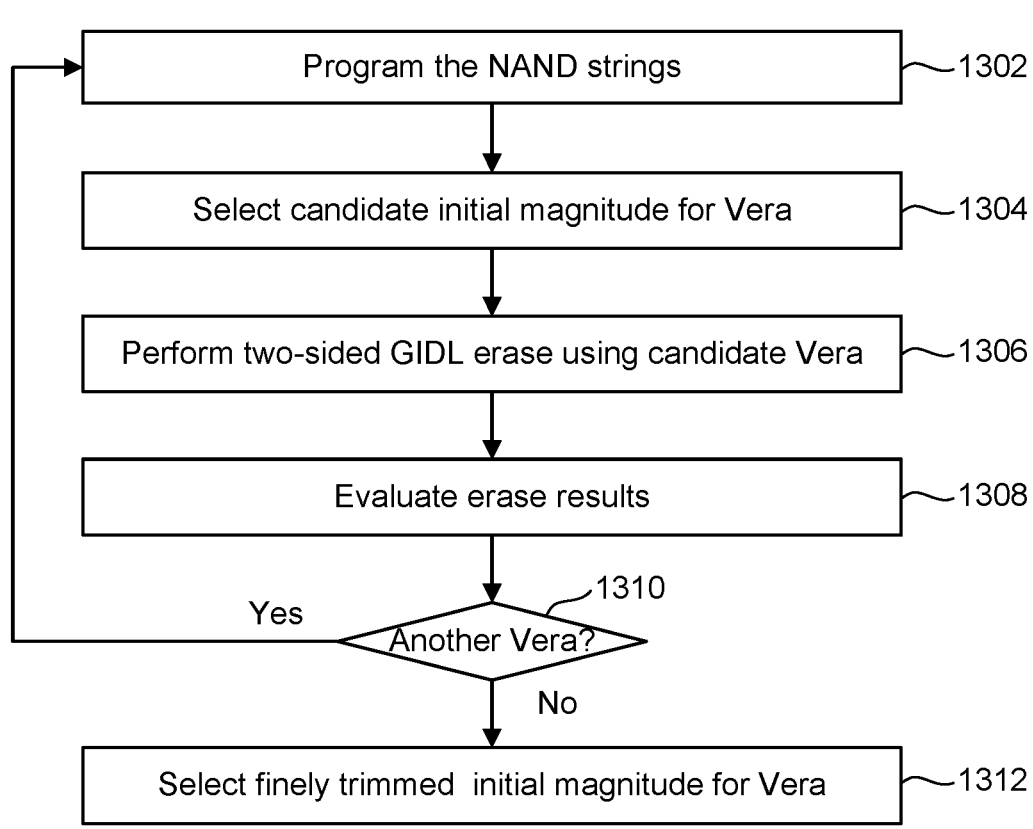
FIG. 13 is a flowchart of one embodiment of a process of fine trimming of the erase voltage (Vera) based on two-sided GIDL erases.

FIG. 13 is a flowchart of one embodiment of a process 1300 of fine trimming of the erase voltage (Vera) based on two-sided GIDL erases. Process 1300 may be used in an embodiment of step 806 in FIG. 8. Process 1300 may be performed by a combination of circuitry on the memory die (200, 201) and a control circuit off the memory die. Step 1302 includes programming the set of NAND strings under test. In one embodiment, all memory cells on the NAND strings are programmed to some target Vt. However, another Vt pattern could be used. Step 1304 includes selecting a magnitude for Vera. Process 1300 will test a number of candidate magnitudes for Vera (for the initial erase loop). These values may center around the coarsely trimmed Vera from step 802 in FIG. 8. Step 1306 includes performing a two-sided GIDL erase using the candidate magnitude Vera in the initial erase loop. Vera may be stepped up each erase loop. Step 1308 in FIG. 13 includes evaluating the results of the erase of step 1306. Step 1308 may evaluate one or more metrics pertaining to the quality of the erase. This evaluation may include, but is not limited to, noting how many erase loops it took to complete erase, measuring the width of the erase distribution, etc. Step 1310 is a determination of whether another candidate initial magnitude for Vera is to be tested. If so, steps 1304-1308 are repeated. When all candidate magnitudes for Vera are tested and evaluated, one of the candidate magnitudes is selected in step 1312 as the finely trimmed initial magnitude for Vera.

Note that process 1300 is described with respect to testing one set of NAND strings, such as one block. However, steps 1302-1310 may be performed on many sets of NAND strings (e.g., many blocks). Then, the finely trimmed Vera may be selected based on analysis of all of the tested blocks.

Figure 14:
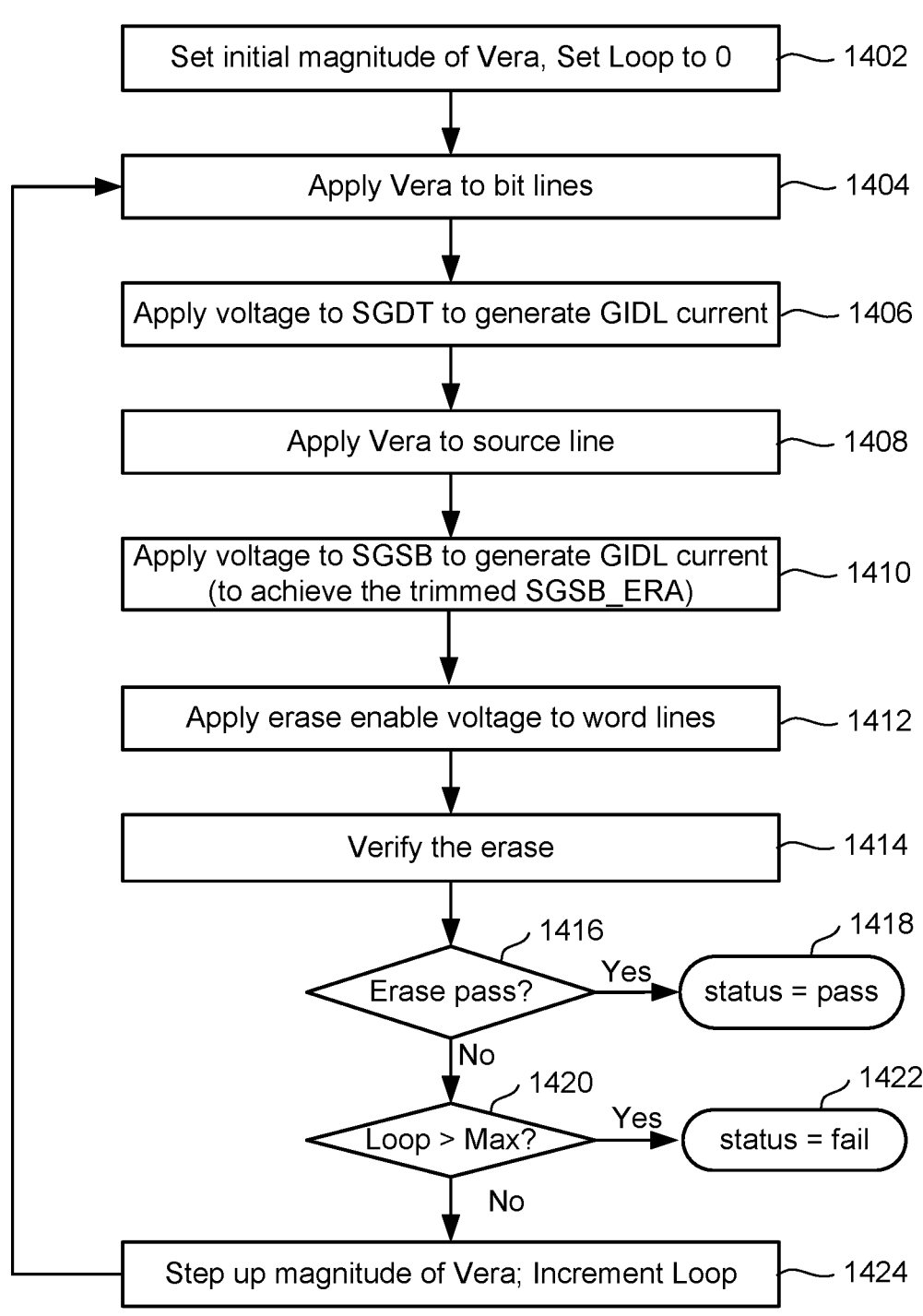
FIG. 14 is a flowchart describing one embodiment of a process for a two-sided GDIL erase.

FIG. 14 is a flowchart describing one embodiment of a process 1400 for a two-sided GDIL erase. Process 1400 is performed in an embodiment of step 1306 in FIG. 13. In an embodiment, circuitry on the die (200, 211) performs process 1400 in response to a command from an off-die control circuit such as memory controller 120. The process 1400 may be used to erase a group of NAND strings in a three-dimensional memory structure.

Step 1402 includes setting an initial magnitude of the erase voltage (Vera). The initial value for Vera may be obtained from step 1304 in FIG. 13. Step 1402 also includes setting a loop counter to 0. Step 1404 includes applying Vera to bit lines associated with the group of NAND strings being erased. Step 1406 includes applying a voltage to the gates of the SGDT transistors to generate GIDL current.

Step 1408 includes applying Vera to the source line. Step 1410 includes applying a voltage (VSGSB) to the gates of the SGSB transistors to generate GIDL current. Steps 1408-1410 result in the trimmed SGSB_ERA being applied from drain to gate of the SGSB transistors.

Step 1412 includes applying an erase enable voltage to the word lines connected to the group of NAND strings being erased. After steps 1404-1412 are performed, an erase verify may be performed in step 1414. The erase verify voltage may be applied to each data WL connected to the group of NAND strings being erased. Step 1416 is a determination of whether erase is complete. If erase has passed then the process 1400 completes with a status of pass in step 1418. If erase has not yet passed then a determination may be made in step 1420 of whether the loop counter has exceeded the maximum. In one embodiment, the erase process is allowed a certain number of loops to complete. If the loop count is greater than the maximum then the process ends with a status of fail in step 1422. If the loop count is not greater than the maximum then the process continues at step 1424. In step 1424, the magnitude of the erase voltage Vera may optionally be increased. Also, the loop count is incremented.

In view of the foregoing, an embodiment includes a system comprising a plurality of source lines and a plurality of NAND strings. Each NAND string has a source side transistor. Each source side transistor has a control gate. Each source side transistor has a drain adjacent to a source line of the plurality of source lines. The system has one or more control circuits in communication with the plurality of NAND strings and the plurality of source lines. The one or more control circuits are configured to apply a region dependent drain-to-gate voltage to the source side transistors of a selected group of the NAND strings during gate-induced drain leakage (GIDL) erase. The drain-to-gate voltage generates a GIDL current to erase memory cells on the selected group of NAND strings.

In a further embodiment, the system comprises a plurality of semiconductor dies that each comprise a different group of NAND strings of the plurality of NAND strings. The region dependent drain-to-gate voltage comprises a die dependent drain-to-gate voltage.

In a further embodiment, the system comprises a plurality of planes that each comprise a different group of NAND strings of the plurality of NAND strings. The region dependent drain-to-gate voltage comprises a plane dependent drain-to-gate voltage.

In a further embodiment, the system comprises a semiconductor die having a plurality of blocks of memory cells that each comprise a different group of NAND strings of the plurality of NAND strings. The plurality of blocks are divided into zones based on location of the blocks on the semiconductor die. The region dependent drain-to-gate voltage comprises a zone dependent drain-to-gate voltage.

In a further embodiment, the region dependent drain-to-gate voltage compensates for region dependent GIDL current generation of the source side transistors on different memory dies that contain the plurality of NAND strings.

In a further embodiment, each NAND string comprises a NAND channel having a diffusion region at a source end of the NAND string. The diffusion region comprises a dopant. The region dependent drain-to-gate voltage compensates for region dependent differences in an amount of the dopant adjacent to the source side transistors.

In a further embodiment, the one or more control circuits are further configured to determine a first region dependent drain-to-gate voltage based on a first plurality of GIDL erases of first NAND strings of the plurality of NAND strings in a first region using candidate drain-to-gate voltages to first source side transistors on the first NAND strings connected to a first source line of the plurality of source lines. The one or more control circuits are further configured to determine a second region dependent drain-to-gate voltage based on a second plurality of GIDL erases of second NAND strings of the plurality of NAND strings in a second region using the candidate drain-to-gate voltages to second source side transistors on the second NAND strings connected to a second source line of the plurality of source lines.

In a further embodiment, the one or more control circuits are further configured to coarsely trim an initial magnitude of a first erase voltage based on a third plurality of drain-side GIDL erases of the first NAND strings using different initial magnitudes for the first erase voltage. The coarsely trimmed initial magnitude of the first erase voltage is applied to the first source line during each initial loop in the first plurality of GIDL erases of the first NAND strings. The one or more control circuits are further configured to coarsely trim an initial magnitude of a second erase voltage based on a fourth plurality of drain-side GIDL erases of the second NAND strings using different initial magnitudes for the second erase voltage. The coarsely trimmed initial magnitude of the second erase voltage is applied to the second source line during each initial loop in the second plurality of GIDL erases of the second NAND strings.

In a further embodiment, the one or more control circuits are further configured to finely trim the initial magnitude of the first erase voltage based on a fifth plurality of two-sided GIDL erases of the first NAND strings that use candidate magnitudes for the initial magnitude of the first erase voltage to the first source line while maintaining the first region dependent drain-to-gate voltage for the first source side transistors on the first NAND. The one or more control circuits are further configured to finely trim the initial magnitude of the second erase voltage based on a sixth plurality of two-sided GIDL erases of the second NAND strings that use candidate magnitudes for the initial magnitude of the second erase voltage to the second source line while maintaining the second region dependent drain-to-gate voltage for the second source side transistors on the second NAND strings.

In a further embodiment, the one or more control circuits are further configured to: a) select a candidate magnitude for a first region dependent drain-to-gate voltage for a first region of the system that contains a first group of NAND strings of the plurality of NAND strings; b) perform a source-side GIDL erase of the first group of NAND strings with the selected candidate magnitude; c) evaluate results of the source-side GIDL erase of the first group of NAND strings; d) repeat said a), said b) and said c) for different candidate magnitudes of the first region dependent drain-to-gate voltage; and e) select a trimmed value for the magnitude for the first region dependent drain-to-gate voltage for the first region that contains the first group of NAND strings based on the results of the source-side GIDL erases of the first group of NAND strings.

In a further embodiment, the one or more control circuits are further configured to repeat said a) through said e) for a second group of NAND strings in a second region of the system to determine a second region dependent drain-to-gate voltage.

An embodiment includes a method for operating non-volatile memory. The method comprises applying a first voltage having a first magnitude to gates of first source side select transistors on a first group of NAND strings on a first semiconductor die while applying a first erase voltage to a first source line connected to the first group of the NAND strings during a first gate-induced drain leakage (GIDL) erase of the first group of the NAND strings. The first source side select transistors are immediately adjacent to the first source line. The method comprises applying a second voltage having a second magnitude to gates of second source side transistors on a second group of NAND strings on a second semiconductor die while applying a second erase voltage to a second source line connected to the second group of the NAND strings during a second GIDL erase of the second group of the NAND strings. The second source side transistors are immediately adjacent to the second source line. The second magnitude is different from the first magnitude. The first erase voltage has the same magnitude as the second erase voltage.

An embodiment includes an apparatus comprising: non-volatile storage; a first source line; a first group of NAND strings, a second source line; a second group of NAND strings, and one or more control circuits in communication with the first group of NAND strings, the first source line, the second group of NAND strings, the second source line, and the non-volatile storage. The first group of NAND strings each have a first source side transistor having a drain connected to the first source line. Each first source side transistor has a gate. The second group of NAND strings each have a second source side transistor having a drain connected to the second source line. Each second source side transistor has a gate. The one or more control circuits are configured to trim a first gate-induced drain leakage (GIDL) current generation voltage for the first source side transistors based on first GIDL erases of the first group of the NAND strings. The one or more control circuits are configured to trim a second GIDL current generation voltage for the second source side transistors based on second GIDL erases of the second group of the NAND strings. The second GIDL current generation voltage has a different magnitude than the first GIDL current generation voltage. The one or more control circuits are configured to store a first value for the first GIDL current generation voltage and a second value for the second GIDL current generation voltage in the non-volatile storage.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A system comprising:
   a plurality of source lines;
   a plurality of NAND strings, each NAND string having a source side transistor, each source side transistor having a control gate, each source side transistor having a drain adjacent to a source line of the plurality of source lines; and
   one or more control circuits in communication with the plurality of NAND strings and the plurality of source lines, the one or more control circuits configured to:
   access region dependent erase parameters for source select transistors on NAND strings from storage in the system, wherein the region dependent erase parameters are tailored to a physical characteristic at a source end of the NAND strings in different regions of the system, the region dependent erase parameters include a first region dependent erase parameter for source side transistors in a first region of the system and a second region dependent erase parameter for source side transistors in a second region of the system, wherein the second region dependent erase parameter is different from the first region dependent erase parameter to compensate for a difference in the physical characteristic between the source end of the NAND strings in the first region and the second region;

apply a first region dependent drain-to-gate voltage to the source side transistors of a first selected group of the NAND strings in the first region of the system based on the first region dependent erase parameter during gate-induced drain leakage (GIDL) erase, wherein the first region dependent drain-to-gate voltage generates a GIDL current to erase memory cells on the first selected group of NAND strings; and apply a second region dependent drain-to-gate voltage to the source side transistors of a second selected group of the NAND strings in the second region of the system based on the second region dependent erase parameter during gate-induced drain leakage (GIDL) erase, wherein the second region dependent drain-to-gate voltage generates a GIDL current to erase memory cells on the second selected group of NAND strings.

2. The system of claim 1, wherein:
the system comprises a plurality of semiconductor dies, a first die includes the first region and a second die includes the second region; and
the first and second region dependent drain-to-gate voltages are die dependent.

3. The system of claim 1, wherein:
the system comprises a plurality of planes, a first plane includes the first region and a second plane includes the second region; and
the first and second region dependent drain-to-gate voltages are plane dependent.

4. The system of claim 1, wherein:
the system comprises a semiconductor die having a plurality of blocks of memory cells that each comprise a different group of NAND strings of the plurality of NAND strings, the plurality of blocks are divided into zones based on location of the blocks on the semiconductor die, a first zone of blocks includes the first region and a second zone of blocks includes the second region; and
the first and second region dependent drain-to-gate voltages are zone dependent.

5. The system of claim 1, wherein the first and second region dependent drain-to-gate voltages compensate for region dependent GIDL current generation of the source side transistors on different memory dies in the system, a first memory die includes the first region and a second memory die includes the second region.

6. The system of claim 1, wherein:
each NAND string comprises a NAND channel having a diffusion region at a source end of the NAND string, the diffusion region comprising a dopant; and
the first and second region dependent drain-to-gate voltages compensate for region dependent differences in an amount of the dopant adjacent to the source side transistors.

7. The system of claim 1, wherein the one or more control circuits are further configured to:

determine the first region dependent drain-to-gate voltage based on an evaluation of a first plurality of GIDL erases of a first set NAND strings in the first region using a corresponding plurality of candidate drain-to-gate voltages to first source side transistors on the first set of NAND strings connected to a first source line of the plurality of source lines;

determine the second region dependent drain-to-gate voltage based on an evaluation of a second plurality of GIDL erases of a second set of NAND strings in the second region using the plurality of candidate drain-to-gate voltages to second source side transistors on the second set of NAND strings connected to a second source line of the plurality of source lines; and store the first region dependent drain-to-gate voltage and the second region dependent drain-to-gate voltage in the storage in the system.

8. The system of claim 7, wherein the one or more control circuits are further configured to:

coarsely trim an initial magnitude of a first erase voltage based on a third plurality of drain-side GIDL erases of the first set of NAND strings using different initial magnitudes for the first erase voltage, wherein the coarsely trimmed initial magnitude of the first erase voltage is applied to the first source line during each initial loop in the first plurality of GIDL erases of the first set of NAND strings; and coarsely trim an initial magnitude of a second erase voltage based on a fourth plurality of drain-side GIDL erases of the second set of NAND strings using different initial magnitudes for the second erase voltage, wherein the coarsely trimmed initial magnitude of the second erase voltage is applied to the second source line during each initial loop in the second plurality of GIDL erases of the second set of NAND strings.

9. The system of claim 8, wherein the one or more control circuits are further configured to:

finely trim the initial magnitude of the first erase voltage based on a fifth plurality of two-sided GIDL erases of the first set of NAND strings that use candidate magnitudes for the initial magnitude of the first erase voltage to the first source line while maintaining the first region dependent drain-to-gate voltage for the first source side transistors on the first set of NAND strings; and finely trim the initial magnitude of the second erase voltage based on a sixth plurality of two-sided GIDL erases of the second set of NAND strings that use candidate magnitudes for the initial magnitude of the second erase voltage to the second source line while maintaining the second region dependent drain-to-gate voltage for the second source side transistors on the second set of NAND strings.

10. The system of claim 1, wherein the one or more control circuits are further configured to:

a) select a candidate magnitude for the first region dependent drain-to-gate voltage for the first region of the system that contains the first selected group of NAND strings;

b) perform a source-side GIDL erase of the first selected group of NAND strings with the selected candidate magnitude;

c) evaluate results of the source-side GIDL erase of the first selected group of NAND strings;

d) repeat said a), said b) and said c) for different candidate magnitudes of the first region dependent drain-to-gate voltage;

e) select a trimmed value for the magnitude for the first region dependent drain-to-gate voltage for the first region that contains the first selected group of NAND strings based on the results of the source-side GIDL erases of the first selected group of NAND strings; and f) store the selected trimmed value for the magnitude for the first region dependent drain-to-gate voltage for the first region in the storage in the system.

11. The system of claim 10, wherein the one or more control circuits are further configured to:

repeat said a) through said e) for the second selected group of NAND strings in a second region of the system to determine the second region dependent drain-to-gate voltage; and store the selected trimmed value for the magnitude for the second region dependent drain-to-gate voltage for the second region in the storage in the system.

12. A method for operating a non-volatile memory system, the method comprising:

accessing die dependent voltages for gates of source select transistors on NAND strings from storage in the non-volatile memory system, wherein the die dependent voltages are tailored to a physical characteristic of source side select transistors of the NAND strings in different semiconductor dies of the non-volatile memory system, the die dependent voltages include a first die dependent gate voltage having a first magnitude for the source side select transistors in a first semiconductor die of the non-volatile memory system and a second die dependent gate voltage having a second magnitude for the source side select transistors in a second semiconductor die of the non-volatile memory system, wherein the second magnitude is different from the first magnitude to compensate for a difference in the physical characteristic between the source side select transistors of the NAND strings in the first semiconductor die and the second semiconductor die;

applying the first die dependent gate voltage having the first magnitude to gates of first source side select transistors on a first group of NAND strings in the first semiconductor die while applying a first erase voltage to a first source line connected to the first group of the NAND strings during a first gate-induced drain leakage (GIDL) erase of the first group of the NAND strings, the first source side select transistors immediately adjacent to the first source line; and applying the second die dependent gate voltage having the second magnitude to gates of second source side transistors on a second group of NAND strings in the second semiconductor die while applying a second erase voltage to a second source line connected to the second group of the NAND strings during a second GIDL erase of the second group of the NAND strings, the second source side transistors immediately adjacent to the second source line, wherein the second magnitude is different from the first magnitude, wherein the first erase voltage has the same magnitude as the second erase voltage.

13. The method of claim 12, further comprising:

a) selecting a candidate initial magnitude for the first die dependent gate voltage to the gates of the first source side select transistors of the first group of NAND strings on the first semiconductor die;

b) performing a source-side GIDL erase of the first group of NAND strings with the candidate initial magnitude of the first die dependent gate voltage applied to the gates of the first source side select transistors of the first group of NAND strings in an initial erase loop, the first voltage stepped up from the candidate initial magnitude in following erase loops;

c) evaluating results of the source-side GIDL erase of the first group of NAND strings;

d) repeating said a), said b) and said c) for different candidate initial magnitudes of the first die dependent gate voltage to the gates of the first source side select transistors of the first group of NAND strings; and e) selecting a trimmed value for the initial magnitude for the first die dependent gate voltage to the gates of the first source side select transistors of the first group of NAND strings based on the results of the source-side GIDL erases of the first group of NAND strings.

14. The method of claim 13, repeating said a) through said e) for the second group of NAND strings on the second semiconductor die to select a trimmed value for the initial magnitude for the second die dependent gate voltage.

15. The method of claim 13, further including:

f) selecting a candidate initial magnitude for an erase voltage to apply to the first source line;

g) performing a two-sided GIDL erase of the first group of NAND strings with the candidate initial magnitude of the erase voltage applied to both bit lines connected to the first group of NAND strings and the first source line connected to the first group of NAND strings in an initial erase loop, including applying the trimmed value for the magnitude for the first die dependent gate voltage to the gates of the first source side select transistors of the first group of NAND strings;

h) evaluating results of the two-sided GIDL erase of the first group of NAND strings of said g);

i) repeating said f), said g) and said h) for different candidate initial magnitudes of the erase voltage; and j) selecting a trimmed value for the initial magnitude for the erase voltage based on the results evaluated in said h).

16. A storage system comprising:

non-volatile storage;

a first source line;

a first group of NAND strings in a first region of the storage system, the first group of NAND strings each having a first source side transistor having a drain connected to the first source line, each first source side transistor having a gate;

a second source line;

a second group of NAND strings in a second region of the storage system, the second group of NAND strings each having a second source side transistor having a drain connected to the second source line, each second source side transistor having a gate; and one or more control circuits in communication with the first group of NAND strings, the first source line, the second group of NAND strings, the second source line, and the non-volatile storage, the one or more control circuits configured to:

trim a first gate-induced drain leakage (GIDL) current generation voltage for the first source side transistors based on first source side GIDL erases of the first group of the NAND strings, including select a first magnitude for the first GIDL current generation voltage from applying and evaluating candidate magnitudes for the first GIDL current generation voltage;

trim a second GIDL current generation voltage for the second source side transistors based on second source side GIDL erases of the second group of the NAND strings, including select a second magnitude for the second GIDL current generation voltage from a applying and evaluating candidate magnitudes for the second GIDL current generation voltage, wherein the second magnitude for the second GIDL current generation voltage has a different magnitude than the first magnitude for the first GIDL current generation voltage;

store a first value for the first magnitude for the first GIDL current generation voltage and a second value for the second magnitude for the second GIDL current generation voltage in the non-volatile storage;

repeatedly use the first magnitude for the first GIDL current generation voltage when erasing NAND strings in the first region of the storage system; and repeatedly use the second magnitude for the first GIDL current generation voltage when erasing NAND strings in the second region of the storage system.

17. The storage system of claim 16, wherein the one or more control circuits are further configured to:

apply the first GIDL current generation voltage between the drains and the gates of the first source side transistors on the first group of the NAND strings during GIDL erase of the first group of the NAND strings, including apply an erase voltage to the first source line; and apply the second GIDL generation voltage between the drains and the gates of the second source side transistors on the second group of the NAND strings during GIDL erase of the second group of the NAND strings, including apply the erase voltage to the second source line.

18. The storage system of claim 16, wherein to trim the first GIDL current generation voltage the one or more control circuits are configured to:

a) select a candidate magnitude for the first GIDL current generation voltage;

b) perform a source-side GIDL erase of the first group of NAND strings with the selected candidate magnitude of the first GIDL generation voltage applied between the drains and the gates of the first source side transistors of the first group of NAND strings;

c) evaluate results of the source-side GIDL erase of the first group of NAND strings;

d) repeat said a), said b) and said c) for different candidate magnitudes of the first GIDL generation voltage; and e) select one of the candidate magnitudes as the trimmed value for the first GIDL current generation voltage based on the results of the source-side GIDL erase of the first group of NAND strings.

19. The storage system of claim 18, wherein the one or more control circuits are further configured to:

repeat said a) through said e) for the second group of NAND strings to the trimmed value for the second GIDL current generation voltage.

20. The storage system of claim 16, wherein the storage system comprises:

a first semiconductor die that comprises the first group of NAND strings; and a second semiconductor die that comprises the second group of NAND strings.

* * * * *